United States Patent [19]

Yokota

[11] Patent Number: 5,163,015

[45] Date of Patent: Nov. 10, 1992

[54] APPARATUS FOR AND METHOD OF ANALYZING COUPLING CHARACTERISTICS

[75] Inventor: Yuko Yokota, Kanagawa, Japan

[73] Assignee: Mitsubishi Denki Kabushiki Kaisha, Japan

[21] Appl. No.: 546,387

[22] Filed: Jun. 29, 1990

[30] Foreign Application Priority Data

Jun. 30, 1989 [JP] Japan .................. 1-168351

[51] Int. Cl.⁵ .............................................. G06F 9/44
[52] U.S. Cl. ....................................... 364/578; 364/512
[58] Field of Search ............... 364/512, 578, 506, 507

[56] References Cited

U.S. PATENT DOCUMENTS

| 4,819,161 | 4/1989 | Konno et al. ............... 364/578 X |
| 4,841,479 | 6/1989 | Tsuji et al. .................. 364/578 X |
| 4,858,146 | 8/1989 | Shebini ....................... 364/578 X |
| 4,933,889 | 6/1990 | Meshkat et al. ................ 364/578 |

Primary Examiner—Dale M. Shaw
Assistant Examiner—S. A. Melnick
Attorney, Agent, or Firm—Wolf, Greenfield & Sacks

[57] ABSTRACT

Characteristics of a coupled system, which consists of a plurality of unit structures coupled together, are analyzed accurately and quickly by providing, between calculating means for calculating transfer function matrices concerning unit structures and coupling means for coupling together transfer function matrices according to the definitions of coupling, co-ordinate conversion means for converting transfer function matrices into those in the overall system.

9 Claims, 17 Drawing Sheets

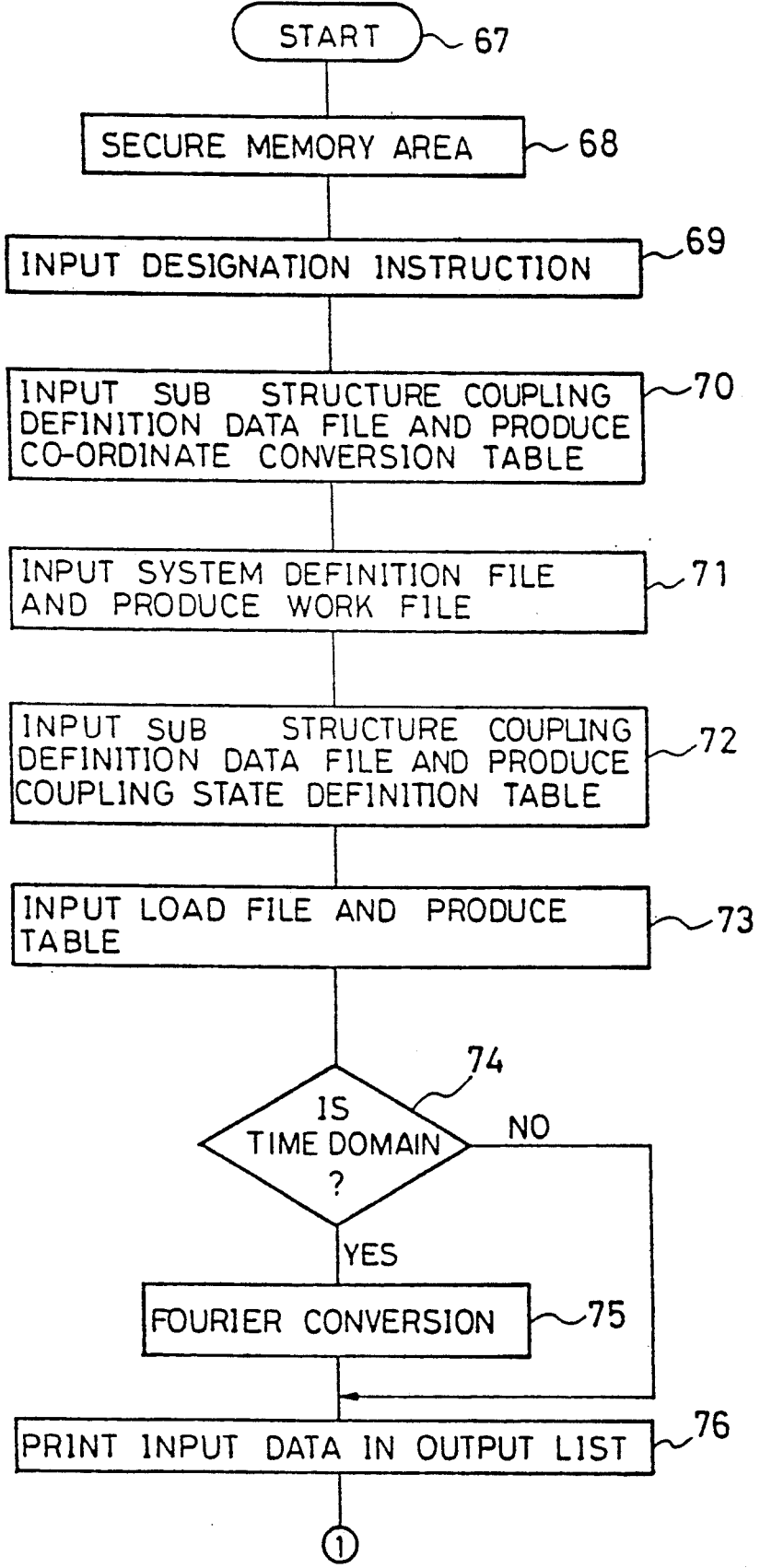

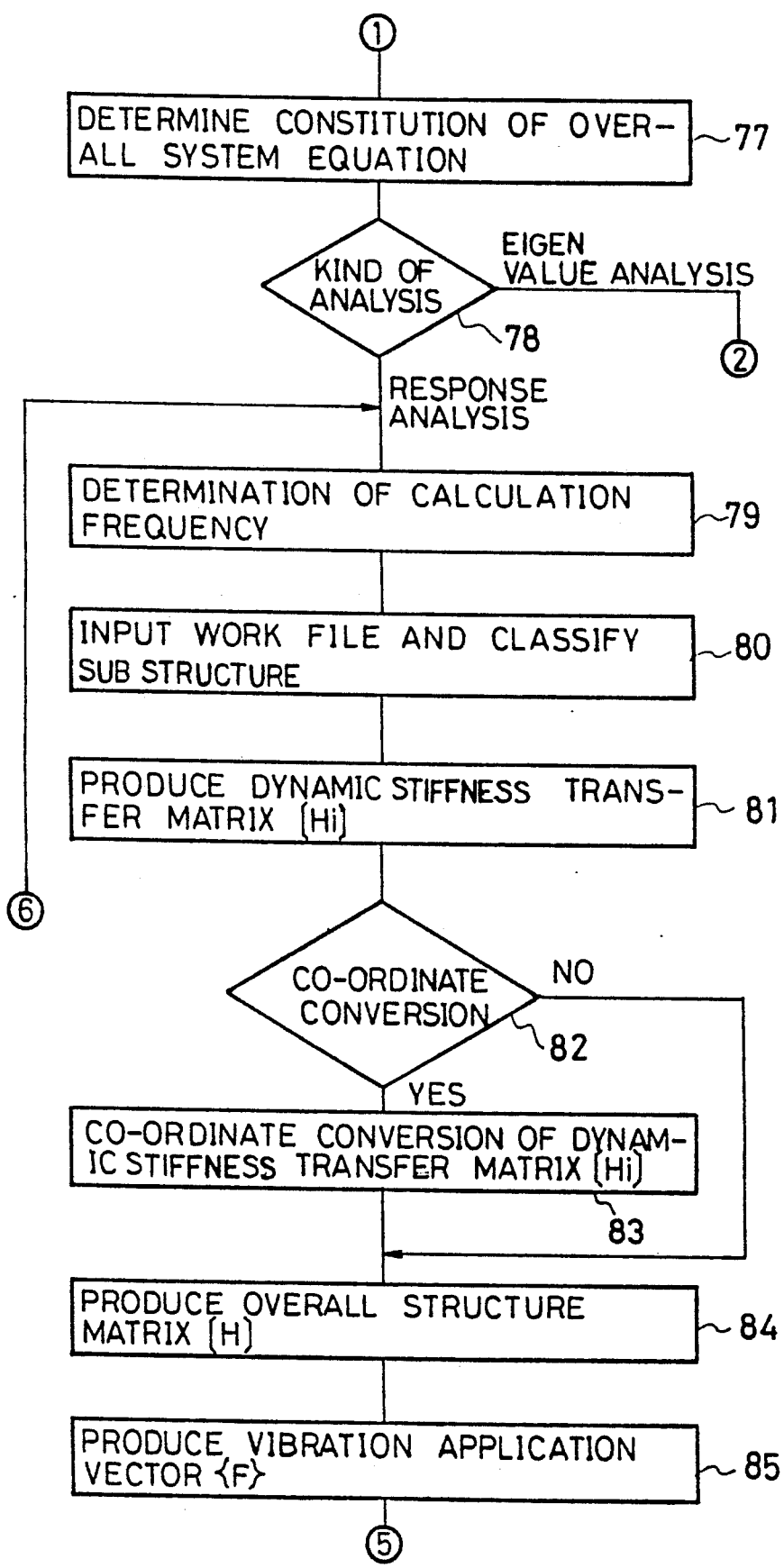

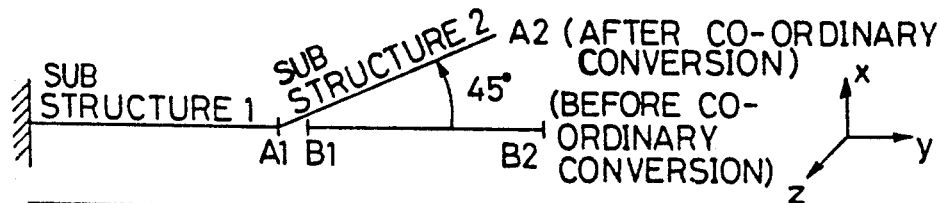

FIG.12(a) PRIOR ART (INPUT DATA) SDF

SUB STRUCTURE 1 — SUB STRUCTURE 2 — A2 (AFTER CO-ORDINARY CONVERSION) (BEFORE CO-ORDINARY CONVERSION) 45°

A1 B1    B2

```
24
A1x, A1y, A1z, A1p, A1q, A1r,
A2x, A2y, A2z, A2p, A2q, A2r,
B1x, B1y, B1z, B1p, B1q, B1r,
B2x, B2y, B2z, B2p, B2q, B2r
```

OVERALL SYSTEM FREEDOM DEFINITION

FIG.12(b) PRIOR ART

51a $$[H^{(1)}] = \begin{bmatrix} H_{xx} & \cdots & H_{x,r} \\ \vdots & & \vdots \\ H_{rx} & \cdots & H_{r,r} \end{bmatrix} \updownarrow A1$$

← A1 →

SUB1. A1x, A1y ~ , A1r.
0

DEFINITION OF SUB STRUCTURE 1

51b $$[H^{(2)}] = \begin{bmatrix} H^{(2)}_{11} & H^{(2)}_{12} \\ H^{(2)}_{21} & H^{(2)}_{22} \end{bmatrix} = \begin{bmatrix} H_{xx} \cdots H_{xr} & H_{xx} \cdots H_{x,r} \\ \vdots & \vdots \\ H_{rx} \cdots H_{r,r} & H_{rx} \cdots H_{r,r} \\ H_{xx} \cdots H_{x,r} & H_{xx} \cdots H_{xr} \\ \vdots & \vdots \\ H_{rx} \cdots H_{r,r} & H_{rx} \cdots H_{r,r} \end{bmatrix} \begin{matrix} \updownarrow \\ B1 \\ \updownarrow \\ \updownarrow \\ B2 \\ \updownarrow \end{matrix}$$

← B1 → ← B2 →

SUB2 B1x, B1y, ~ , B1r.
     B2x, B2y, ~ , B2r.
0

DEFINITION OF SUB STRUCTURE 2

FIG.12 (c) PRIOR ART

| {Xd}= | [Γ₁₁] | [Γ] | | | | [Γ₁₂] | | | | | | {Xi} |
|---|---|---|---|---|---|---|---|---|---|---|---|---|
| A1x | 0.7071 | 0.7071 | 0 | 0 | 0 | 0 | 0 | 0 | 0 | 0 | 0 | 0 | B1x |
| A1y | 0.7071 | 0.7071 | 0 | 0 | 0 | 0 | 0 | 0 | 0 | 0 | 0 | 0 | B1y |
| A1z | 0 | 0 | 1 | 0 | 0 | 0 | 0 | 0 | 0 | 0 | 0 | 0 | B1z |
| A1p | 0 | 0 | 0 | 0.7071 | 0.7071 | 0 | 0 | 0 | 0 | 0 | 0 | 0 | B1p |
| A1q | 0 | 0 | 0 | 0.7071 | 0.7071 | 0 | 0 | 0 | 0 | 0 | 0 | 0 | B1q |
| A1r | 0 | 0 | 0 | 0 | 0 | 1 | 0 | 0 | 0 | 0 | 0 | 0 | B1r |
| A2x | 0 | 0 | 0 | 0 | 0 | 0 | 0.7071 | 0.7071 | 0 | 0 | 0 | 0 | B2x |
| A2y | 0 | 0 | 0 | 0 | 0 | 0 | 0.7071 | 0.7071 | 0 | 0 | 0 | 0 | B2y |
| A2z | 0 | 0 | 0 | 0 | 0 | 0 | 0 | 0 | 1 | 0 | 0 | 0 | B2z |
| A2p | 0 | 0 | 0 | 0 | 0 | 0 | 0 | 0 | 0 | 0.7071 | 0.7071 | 0 | B2p |
| A2q | 0 | 0 | 0 | 0 | 0 | 0 | 0 | 0 | 0 | 0.7071 | 0.7071 | 0 | B2q |
| A2r | 0 | 0 | 0 | 0 | 0 | 0 | 0 | 0 | 0 | 0 | 0 | 1 | B2r |

|  | BASE SECTION | | | | EXPANSION SECTION | |
|---|---|---|---|---|---|---|
|  | A1 | B1 | B2 | A2 | A1 | A2 |
| BASE SECTION A1 | $H^{(1)}$ | 0 | 0 | 0 | $-1$ | 0 |
| B1 | 0 | $H^{(2)}_{11}$ | $H^{(2)}_{12}$ | 0 | $\Gamma^T_{11}$ | $\Gamma^T_{12}$ |
| B2 | 0 | $H^{(2)}_{21}$ | $H^{(2)}_{22}$ | 0 | $\Gamma^T_{21}$ | $\Gamma^T_{22}$ |
| A2 | 0 | 0 | 0 | →0 | 0 | $-1$ |
| EXPANSION SECTION A1 | $-1$ | $\Gamma_{11}$ | $\Gamma_{12}$ | 0 | 0 | 0 |
| A2 | 0 | $\Gamma_{21}$ | $\Gamma_{22}$ | $-1$ | 0 | 0 |

DIAGONAL COMPONENTS OF BASE SECTION ARE 0.

(WHEN SOLVING SIMULTANEOUS LINEAR EQUATIONS AS SYMMETRIC MATRIX, NO ROW IS INTERCHANGED, THAT NO SOLUTION CAN BE OBTAINED UNLESS INFINITESIMAL VALUE IS SUBSTITUTED.)

→ CAUSE OF ERROR

APPARATUS FOR AND METHOD OF ANALYZING COUPLING CHARACTERISTICS

BACKGROUND OF THE INVENTION

1. Field of the Invention

This invention relates to the analysis of characteristics of an overall structure consisting of a plurality of sub structures coupled together and, more particularly, to a system for and a method of analyzing characteristics of an overall structure such as a structure vibration simulation system, which analyzes vibrations of a plurality of structures, either theoretically by a finite element method utilizing a computer or experimentally by using a conventional FFT analyzer used for vibration analysis, and estimates vibration characteristics of an overall structure obtained by coupling together these structures by using a computer before actually manufacturing such overall structure.

2. Description of the Prior Art

An overall structure characteristics analyzer will now be described in conjunction with a structure vibration simulation system. Computer-aided engineering (CAE), which is used in the design of structures, particularly machine structures for performing modeling and simulation of structures with a computer before trial manufacture, has been attracting attention as a powerful means for reducing development time and cost. In the CAE, vibration analysis is important as a reliability evaluation method in the design of machine structures. As prior art methods of vibration analysis of machine structures, there are an experimental FFT (fast Fourier transform) analysis method and a theoretical finite element analysis method. Further, there is a sub structure synthesis method (or a building block approach) as disclosed in Japanese Patent Application 63-060766, in which the experimental FFT analysis and theoretical analysis based on the finite element method are performed with respect to each element (sub structure) of a machine structure to be analyzed, and the results of the analyses are used to numerically simulate the vibration characteristics of the machine structure (overall structure).

In the experimental FFT analysis method, the operations of causing vibrations of a machine structure, measuring responses at this time, sampling these signals with an A-D converter, supplying sampled digital data to a minicomputer or microcomputer, performing FFT of the data and producing a transfer function between the vibration application point and the response point, are performed repeatedly for various points of the machine structure, and modal parameters such as peculiar vibration frequency of the structure, damping ratio and vibration mode by means of curve fitting (or modal analysis). This method is used as an important means for obtaining the vibration characteristics of the actual structure.

The finite element method, on the other hand, is a method of theoretical analysis utilizing a computer. In this method, a machine structure is thought to be capable of being expressed by a collection of a finite number of finite elements. A relation between an externally applied force and a resultant deformation is obtained for each element. These relations are used to define a displacement function concerning the relation between an externally applied force and a resultant deformation of the overall machine structure. Using this displacement function, a stiffness matrix [K] and a mass matrix [M] are obtained to solve an eigen value problem given as $$[M]\{\ddot{x}\}+[K]\{x\}=\{o\} \tag{1}$$

where $\{x\}$ represents a displacement vector, and ... represents a second order time differential. Also, the peculiar vibration frequency and vibration mode of the structure are obtained. Further, an equation of motion given as $$[M]\{\ddot{x}\}+[C]\{\dot{x}\}+[K]\{x\}=\{f\} \tag{2}$$

where [M] represents a mass matrix. [C] an damping matrix, $[C]=\alpha[M]+\beta[K]$, $\alpha$ and $\beta$ damping ratios, [K] a stiffness matrix, $\{f\}$ external force, $\{\ddot{x}\}$, $\{\dot{x}\}$ and $\{x\}$ displacement, velocity and acceleration vectors, is solved to obtain the response analysis of each element.

The sub structure synthesis method is one in which experimental FFT analysis and theoretical analysis based on the finite element method are performed with respect to each element (or sub structure) of the machine structure for analysis, and results of the analyses are numerically simulated. A specific example of this method will now be described with reference to FIG. 9.

FIG. 9 illustrates a simulation concerning a railway car design. Referring to the Figure, reference numeral 100 designates a car body, 101 a chassis, and 102 and 103 local bases A and B. These parts constitute elements of the railway car. Designated at 110 to 113 are examples of vibration characteristic of car body 100, chassis 101 and local bases A 102 and B 103, respectively, and 121 is an example of vibration characteristic of overall system obtained by sub structure synthesis method 120. In the graphs of the vibration characteristic examples, the ordinate x is taken for the vibration response, and the abscissa f is taken for the frequency. Designated at 200 is a co-ordinate system, in which the railway car is found.

This co-ordinate system represents a three-dimensional co-ordinate space defined by perpendicular x, y and z axes. Designated at 11 to 14, 21 to 24 and 31 to 34 are points of measurement selected in car body 100 and chassis 101. Designated at A and B are selected points of measurement in chassis 101 and local bases A 102 and B 103. Points of measurement designated by like reference numerals or symbols constitute a point of coupling when the individual elements are coupled together. Generally, vibration response at one point of measurement may be examined by considering the following six different directions as shown in co-ordinate system 200:

(1) Direction (x) of the x axis,
(2) Direction (y) of the y axis,
(3) Direction (z) of the z axis,
(4) Direction (p) of rotation about the x axis,
(5) Direction (q) of rotation about the y axis, and
(6) Direction (r) of rotation about the z axis.

These directions are referred to as degrees of freedom. Thus, there are at most six degrees of freedom at one point of measurement. In a system in which the directions p, q and r of rotation can be ignored, there are only three degrees x, y and z of freedom. Further, where only a spring undergoes a vertical motion, there is only a single degree of freedom (in the sole direction x, for instance).

Now, the determination of a transfer function which is extensively used for analyzing vibration characteristics of elements will be described.

If 12 points 11 to 34 of measurement in car body 100 each have three degrees x to z of freedom, there is a total of N=12×3=36 degrees of freedom.

In this way, one or more points of measurement with a total of N degrees of freedom are selected in a structure, with numerals 1, 2, ... N provided to designate the individual degrees of freedom, and by setting a degree m of freedom to be a direction of response and another degree l of freedom to be a direction of vibration application, a vibration of a predetermined waveform (the vibration being expressed as displacement, velocity or acceleration of the pertinent point of measurement) is applied in the direction of vibration application, and vibration in the direction of response is measured.

In this case, the frequency spectrum of vibrations in the direction of vibration application is well known, and as for the frequency spectrum of vibration in the direction of vibration application, the vibration transfer function H between the direction l of pressure application and the direction m of response can be expressed as a function H m, l(ω) of angular frequency ω to determine H m, 1 (ω), H m, 2 (ω), ... , H m, $_N$ (ω). Further, H m, m (ω)=1 and H m, l (ω)=H l, m(ω), which is referred to as the theorum of reciprocity.

This transfer function H m, (ω) is set as an N×N matrix
to obtain a transfer function matrix $$\left[ G^{(k)}_{(\omega)} \right]$$

with respect to the sub structure, given as $$\left[ G^{(k)}_{(\omega)} \right] = \begin{bmatrix} H_{1,1}(\omega) & H_{1,2}(\omega) \ldots H_{1,l}(\omega) \ldots H_{1,N}(\omega) \\ H_{2,1}(\omega) & H_{2,2}(\omega) \\ H_{m,1}(\omega) & \text{---------} H_{m,l}(\omega) \\ H_{N,1}(\omega) & \text{---------} H_{N,N}(\omega) \end{bmatrix} \quad (3)$$

Then, by denoting a force fl applied in each direction l of vibration application, an external force vector $F^{(k)}$ with respect to sub structure k in directions 1 to N of vibration application is expressed as $$\{F^{(k)}\} = \begin{Bmatrix} f_1 \\ f_2 \\ f_l \\ f_N \end{Bmatrix} \quad (4)$$

An equation of motion expressed by a transfer function for each local structure is $$[G^{(k)}]\{F^{(k)}\} = \{x^{(k)}\} \quad (5)$$

$$\begin{bmatrix} \text{where} & \{F^{(k)}\}: & \text{is an external force vector given to a degree of freedom of sub structure } k, \\ & \{x^{(k)}\}: & \text{is a displacement vector of a degree of freedom of sub structure } k, \text{ and} \\ & [G^{(K)}]: & \text{is a transfer function matrix of sub structure } k. \end{bmatrix}$$

The transfer function calculated here concerns the transfer function matrix $$\left[ G^{(k)}_{(\omega)} \right]$$

of compliance (displacement/force), and for conversion to the transfer function matrix $$\left[ H^{(k)}_{(\omega)} \right]$$

of dynamic stiffness (force/displacement), it is converted to the transfer function of dynamic stiffness by obtaining the inverse matrix by using an equation $$\left[ H^{(k)}_{(\omega)} \right] = \left[ G^{(k)}_{(\omega)} \right]^{-1} \quad (6)$$

In this way, an equation of motion given as $$[H^{(k)}_{(\omega)}]\{x^{(k)}\} = \{F^{(k)}\} \quad (7)$$

is given for each local structure.

Now, a method of obtaining an overall system equation by coupling together the individual sub structures will be described.

First, a method of obtaining a system by coupling together two sub structures and producing an equation of motion of the system will be described. Of the two sub structures, the degrees of freedom are classified to be those ({xm$^{(1)}$}, {xm$^{(2)}$}) where a further sub is coupled and those ({xr$^{(1)}$}, {xr$^{(2)}$}) where no further sub structure is coupled. For example, xm$^{(1)}$ and xm$^{(2)}$ may be thought to be the degrees of freedom of points of measurement which show the same response when and only when sub structures are coupled together by bolting. The equations of motion of individual the sub structures are given as $$\begin{bmatrix} Hrr^{(1)}(\omega) & Hrm^{(1)}(\omega) \\ Hmr^{(1)}(\omega) & Hmm^{(1)}(\omega) \end{bmatrix} \begin{Bmatrix} xr^{(1)} \\ xm^{(1)} \end{Bmatrix} = \begin{Bmatrix} Fr^{(1)} \\ Fm^{(1)} \end{Bmatrix} \quad (8)$$

$$\begin{bmatrix} Hmm^{(2)}(\omega) & Hmr^{(2)}(\omega) \\ Hrm^{(2)}(\omega) & Hrr^{(2)}(\omega) \end{bmatrix} \begin{Bmatrix} xm^{(2)} \\ xr^{(2)} \end{Bmatrix} = \begin{Bmatrix} Fm^{(2)} \\ Fr^{(2)} \end{Bmatrix} \quad (9)$$

When {xm$^{(1)}$} and {xm$^{(2)}$} are coupled together, the equation of motion of the individual sub structures are now $$\begin{bmatrix} Hrr^{(1)}(\omega) & Hrm^{(1)}(\omega) \\ Hmr^{(1)}(\omega) & Hmm^{(1)}(\omega) \end{bmatrix} \begin{Bmatrix} xr^{(1)} \\ xm^{(1)} \end{Bmatrix} = \begin{Bmatrix} Fr^{(1)} \\ Fm - p^{(1)} \end{Bmatrix} \quad (10)$$

$$\begin{bmatrix} Hmm^{(2)}(\omega) & Hmr^{(2)}(\omega) \\ Hrm^{(2)}(\omega) & Hrr^{(2)}(\omega) \end{bmatrix} \begin{Bmatrix} xm^{(2)} \\ xr^{(2)} \end{Bmatrix} = \begin{Bmatrix} Fm + p^{(2)} \\ Fr^{(2)} \end{Bmatrix} \quad (11)$$

where $\{P\}$ represents force applied by sub structure 1 to sub structure 2 and $\{-p\}$ represents force applied by sub structure 2 to sub structure 1. By removing p by using equations (7) and (11) and a coupling condition $$\{xm^{(1)}\} = \{xm^{(2)}\}(=xm)) \quad (12)$$

we obtain $$\begin{bmatrix} Hrr^{(1)}(\omega) & Hrm^{(1)}(\omega) & 0 \\ Hmr^{(1)}(\omega) & Hmm^{(1)}(\omega) + Hmm^{(2)}(\omega) & Hmr^{(2)}(\omega) \\ 0 & Hrm^{(2)}(\omega) & Hrr^{(2)}(\omega) \end{bmatrix} \quad (13)$$

$$\begin{Bmatrix} xr^{(1)} \\ xm \\ xr^{(2)} \end{Bmatrix} = \begin{Bmatrix} Fr^{(1)} \\ Fm \\ Fr^{(2)} \end{Bmatrix}$$

This equation is an equation of motion of the system obtained by coupling together the two sub structures. Here, $\{Fm\}$ is $\{Fm\} = \{Fm^{(1)}\} + \{Fm^{(2)}\}$ and represents an external force acting on coupling point $\{xm\}$. The method of producing the equation of motion of the system obtained by coupling together two sub substructures can be seen by expressing the coefficient matrix of equation (13) as

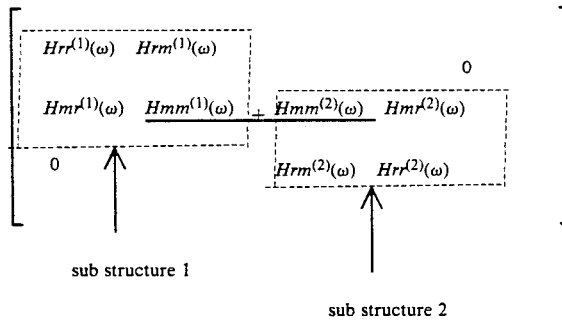

COUPLING BETWEEN SUB STRUCTURES 1 AND 2

An equation of the overall system is produced by coupling together sub structures in the method described above in the order of the input of the sub structures. When the overall system is produced by coupling together N sub structures, $[H(\omega)]$ of the system is as shown in FIG. 10.

In this way, we obtain the equation of the overall system as $$[H(\omega)]\{x\} = \{F\} \quad (14)$$

This equation is applied in the case where a degree of freedom provides a response independent of other degrees of freedom. Actually, there is a case where a certain degree of freedom is depend on a different degree of freedom. This relation is referred to as a restrictive relation between degrees of freedom.

This constraint relation will now be described with reference to FIG. 9. When there is a vibration in the x direction of point A of measurement (i.e., Ax direction) and also there is a vibration response in x direction at point 11 of measurement (i.e., 11x direction), Ax is referred to as an independent degree of freedom, and 11x is a dependent degree of freedom. The constraint relation in this case is 12 times.

Concerning such constraint relation, a constraint relation matrix $[\Gamma]$ is produced. Denoting a displacement vector of an independent degree of freedom as $\{x_i\}$ and a displacement vector of a dependent degree of freedom as $\{x_d\}$, we have $$\{x_d\} = [\Gamma]\{x_i\} \quad (15)$$

as a constraint relation equation.

It is necessary to substitute this constraint relation into the overall system equation (14) to obtain a correct simulation of the response. Before describing a method of stitution of the constraint relation into the overall system equation, a way of thinking of co-ordinate conversion utilizing this constraint relation will be described.

The introduction of the constraint relation as noted above is used in the case where there is a dependent relation among the degrees of freedom of the total structure.

This constraint relation is utilized for the co-ordinate conversion to be described later.

In the conventional sub structure synthesis method, if a co-ordinate space for analyzing sub structure data by the finite element method or experimental FFT analysis and co-ordinate space where the overall structure is located are different from each other, the co-ordinate space when performing the sub structure analysis and co-ordinate space where the overall structure is located are related to each other by using the constraint relation among degrees of freedom. For example, data obtained by measuring a certain sub structure with a certain co-ordinate system can not be used directly if the co-ordinate system is different from the co-ordinate system of the overall structure including the sub structure. For example, when data is obtained with the sub structure held in a horizontal state and the sub structure is coupled at an angle of 45 degrees, it is necessary to convert the data for the case where the sub structure is at an angle of 45 degrees.

An noted before, the displacement vector $\{x_i\}$ of the independent degree of freedom at the time of the sub structure analysis and displacement vector $\{x_d\}$ of the dependent degree of freedom of the sub structure in the co-ordinate space where the overall structure is located are related using a constraint relation matrix $[\Gamma]$ as $$\{x_d\} = [\Gamma]\{x_i\} \quad (16)$$

It is noted before that $[\Gamma]$ is given absolutely by the relation between $\{x_i\}$ and $\{x_d\}$ in equation (16) in a constraint relation among degrees of freedom. Into this constraint relation, the constraint relation of the points and the positional relation of co-ordinate systems for co-ordinate conversion are substituted.

Now, a method of substituting this constraint relation matrix [Γ] into the overall system equation will be described.

In the sub structure synthesis method, the constraint relation is applied to the overall system equation (14) as follows.

First, displacement vectors $\{x\}$ of degrees of freedom of the overall system are divided into $\{x_d\}$, $\{x_i\}$ and $\{x_r\}$, that is, $$\{x\} = \begin{Bmatrix} x_d \\ x_i \\ x_r \end{Bmatrix} \tag{17}$$

Here, $\{x_r\}$ represents degrees of freedom which do not appear in the constraint relation equation (16). With this division of degrees of freedom, equation (14) is changed to $$\begin{bmatrix} H_{dd} & H_{di} & H_{dr} \\ H_{id} & H_{ii} & H_{ir} \\ H_{rd} & H_{ri} & H_{rr} \end{bmatrix} \begin{Bmatrix} x_d \\ x_i \\ x_r \end{Bmatrix} = \begin{Bmatrix} F_d \\ F_i \\ F_r \end{Bmatrix} \tag{18}$$

Constraint relation equation (16) means that restrictive forces $\{p_d\}$ and $\{p_i\}$ act on $\{x_d\}$ and $\{x_i\}$. Thus, when there is a constraint relation, the overall system equation is given as $$\begin{bmatrix} H_{dd} & H_{di} & H_{dr} \\ H_{id} & H_{ii} & H_{ir} \\ H_{rd} & H_{ri} & H_{rr} \end{bmatrix} \begin{Bmatrix} x_d \\ x_i \\ x_r \end{Bmatrix} = \begin{Bmatrix} F_d + P_d \\ F_i + P_i \\ F_r \end{Bmatrix} \tag{19}$$

$\{P_d\}$ and $\{P_i\}$ are related as $$\{P_i\} = -[\Gamma]\{P_d\} \tag{20}$$

By using this relation, equation (19) is changed to $$\begin{bmatrix} H_{dd} & H_{di} & H_{dr} & -I \\ H_{id} & H_{ii} & H_{ir} & \Gamma^T \\ H_{rd} & H_{ri} & H_{rr} & 0 \end{bmatrix} \begin{Bmatrix} x_d \\ x_i \\ x_r \\ P_d \end{Bmatrix} = \begin{Bmatrix} F_d \\ F_i \\ F_r \end{Bmatrix} \tag{21}$$

(I represents unit matrix, and T represents transposed). This equation is combined with equation (16) to obtain an overall system equation including the constraint relation as $$\begin{bmatrix} H_{dd} & H_{di} & H_{dr} & -I \\ H_{id} & H_{ii} & H_{ir} & \Gamma^T \\ H_{rd} & H_{ri} & H_{rr} & 0 \\ -I & \Gamma & 0 & 0 \end{bmatrix} \begin{Bmatrix} X_d \\ X_i \\ X_r \\ P_d \end{Bmatrix} = \begin{Bmatrix} F_d \\ F_i \\ F_r \\ 0 \end{Bmatrix} \tag{22}$$

The vibration characteristics of the overall structure can be analyzed by solving this equation (22).

FIG. 11 is a block diagram showing a prior art example of a structural vibration simulation system. Referring to the Figure, designated at 51a and 51b are sub structure data memories for storing data of first and second sub structures, at 52a and 52b transfer function calculation means for calculating transfer function matrices of the structure from sub structure data obtained from sub structure data memories 51a and 51b (i.e., sub structure data obtained by measuring or analytically estimating the vibrations of the first and second sub structures), at 53 a sub structure coupling definition data memory for storing coupling conditions indicative of whether the coupling is rigid or soft, constraint relation matrices representing constraint relations of the individual degrees of freedom and co-ordinate conversion matrices overlapping the constraint relation matrices, and at 55 coupling means for coupling transfer function matrices of the first and second structures obtained from transfer function calculation means 52a and 52b to the sub structure coupling definition data memory 53 in accordance with a predetermined coupling condition to produce a transfer function matrix of the overall structure after coupling.

Designated at 59 is eigen value analysis means for analyzing eigen mode and mode shape of the overall structure after coupling with the transfer function matrix data from coupling means 55, at 60 an eigen value analysis result memory for storing analysis results obtained from eigen value analysis means 59, at 61 a time domain vibration application data memory for strong time domain vibration application data of the structure, and at 62 Fourier analysis means for Fourier analysis converting the time domain vibration application data into frequency domain vibration application data for analysis in the frequency domain.

Designated at 56 is a frequency domain vibration application data memory for strong frequency domain vibration application data obtained from the Fourier analysis means, at 57 frequency domain response analysis means for analyzing the response in the frequency domain at each point of the structure after coupling with the transfer function matrix data from coupling means 55 and the frequency domain vibration application data from Fourier analysis means 62 (i.e., frequency domain vibration application data from frequency domain vibration application data memory 56), and at 58 frequency domain response result memory for storing frequency domain response analysis results obtained from the frequency domain response analysis means 57.

Designated at 63 is inverse Fourier analysis means for converting the frequency response analysis results obtained from frequency domain response analysis means 57 (i.e., contents of the frequency domain response result memory 58) into time domain response analysis results, and at 64 a time domain response result memory for storing the time domain response analysis results.

Now, a prior art example will be described with reference to FIGS. 12(a) to 12(c). FIG. 12(a) is a schematic view showing an overall structure consisting of sub structures 1 and 2. Sub structure 1 is a cantilever structure secured at one end to a wall and having a point A1 of measurement at the other end. Sub structure 2 is a free-free beam structure with the opposite ends measured at points B1 and B2 of measurement and coupled to sub structure 1 in a state A1-A2 at an angle of 45 degrees in the x direction. FIG. 12(b) shows a system definition file (SDF) as an example of sub structure data memory 51a and 51b. In this file, the degrees of freedom of the overall system and sub structures 1 and 2, as shown at 51a and 51b, are defined. There are 24 definitions of degrees of freedom for the overall system.

This is so because there are six degrees (x to z and p to r) of freedom at each of four points A1, A2, B1 and B2 of measurement. In sub structure 1 definition file 51a, data for transfer function matrix [H$^{(1)}$] for the six degrees of freedom at point A1 of measurement of sub structure 1 is stored. In sub structure 2 definition file 52b, data for transfer function matrix [H$^{(2)}$] for a total of 12 degrees of freedom at points B1 and B2 of measurement is stored.

FIG. 12(c) shows a vibration application constraint data file (ALF) as an example of frequency domain vibration application data memory 56 and sub structure coupling definition data memory 53. This file includes a file 61 for storing definitions of the kind and size of forces applied and a file 53 for defining a constraint relation including co-ordinate conversion.

Definition file 61 represents obtaining a frequency response (SINUSOIDAL) when an external force with an amplitude of 1.0 and a phase of 0.0 degree is applied to degree of freedom A2x (x direction at point A2 of measurement).

In constraint relation definition file 53, the number n of independent degrees of freedom and the number m of dependent degrees of freedom are defined in CON n, m and are sequentially listed. In this example, 12 degrees of freedom B1a to B2x are independent, and degrees of freedom A1x to A2x are dependent. The dependance relation is shown such that A1x is depend on B1a, A1y on B1y and so forth. In this way, it is shown here that the six degrees of freedom at point B1 of measurement are all dependent on six degrees of freedom at point A1 of measurement, indicating rigid coupling at these points. Regarding [Γ], while sub structure 2 is held for measurement in a horizontal state (B1-B2), it is coupled to sub structure 1 in an inclined state (A1-A2) at an angle of 45 degrees with respect to the x direction, its co-ordinate conversion matrix is entered using the intrinsic constraint relation.

FIG. 13 shows the constraint relation. The constraint relation matrix [Γ] does not contain any real constraint relation but includes only a co-ordinate conversion matrix. For example, considering the degrees of freedom in x to z direction at A2, $$A2x = 0.7071 B2x + 0.7071 B2y \qquad (23)$$

$$A2y + 0.7071 B2x + 0.7071 B2y \qquad (24)$$

$$A2z = B2z \qquad (25)$$

It will be seen that the degrees of freedom in x to z directions at B2 are converted to the degrees of freedom in x to z directions at A2.

FIG. 14 shows the transfer function matrix of the overall system produced on the basis of a model as shown in FIG. 12. In the Figure, like reference symbols designate like or corresponding parts. Designated at I is a unit matrix. Referring to the Figure, a basic section is a matrix formed with respect to all (24) degrees of freedom defined by the overall system degree of freedom definitions in the SDF. The matrix components in the A2 portion of the base section are all "0" because there is no data concerning the A2 portion in the definitions of sub structures 1 and 2 in the SDF. More specifically, sub structure 2 is held in a horizontal state (B1-B2) for measurement, while no data at A2 after the coupling is present in the definitions of the sub structures.

Since A1 and B1 are coupled together, H$^{(1)}$+H$^{(2)}$ should be calculated as in equation (15). However, since their co-ordinate systems are different, the two can not be simply added, and they have to be held as separate elements.

In an expanded section, 12 dependent degrees of freedom at A1 and A2 are arranged such that [Γ] the constraint relation matrix of B1 and B2 is arranged as in equation (22). (By interchanging the rows and columns in FIG. 11 the same form as in equation (22) is obtained.)

As shown, the matrix even of a simple example as shown in FIG. 12(a) is a matrix of 36 by 36 degrees of freedom, and its solution requires a long calculation time.

As is shown, the prior art method using the constraint relation equation is used when the degrees of freedom of the entire structure involve a dependent relation (i.e., when a motion of a degree of freedom depends on a motion of a different degree of freedom.) In other words, no dependent relation of the entire degrees of freedom of a certain sub structure to the entire degrees of freedom of a different sub structure is defined.

However, when this method is used for the conversion of the co-ordinate system of a sub structure to the co-ordinate system of the overall structure as noted above, for co-ordinate conversion of one of the two sub structures as shown in FIG. 12(a), the overall system equation is, from equation (22), $$\begin{bmatrix} 0 & 0 & 0 & -I \\ - & H_{ii} & 0 & \Gamma^T \\ 0 & 0 & H_{rr} & 0 \\ -I & \Gamma & 0 & 0 \end{bmatrix} \begin{bmatrix} X_d \\ X_i \\ X_r \\ P_d \end{bmatrix} = \begin{bmatrix} F_d \\ 0 \\ F_r \\ 0 \end{bmatrix} \qquad (26)$$

where

[H$_{ii}$]: represents a transfer function matrix [H$^{(2)}$] requiring co-ordinate conversion,

[H$_{rr}$]: represents a transfer function matrix H$^{(1)}$ requiring no co-ordinate conversion,

[Γ]: represents a constraint relation matrix for co-ordinate conversion,

{X$_d$}: represents a displacement vector of a degree of freedom after co-ordinate conversion, {X$_i$}: represents a displacement vector of a degree of freedom before co-ordinate conversion, {X$_r$}: represents another displacement vector of a degree of freedom, {F$_d$}: represents an external force vector of a degree of freedom as the subject of co-ordinate conversion, and {F$_r$}: represents another external force vector of a degree of freedom.

Generally, the transfer function matrix [H] of the overall structure in the overall system equation given as $$[H]\{x\} = \{f\} \qquad (27)$$

is a symmetrical matrix.

Thus, when solving equation (27) using a computer, the solution of [M] as a symmetrical matrix requires only one half of the memory and is efficient. For this reason, this method is used broadly.

However, the solution of simultaneous equations of a symmetrical matrix does not permit such a process as interchange of rows. For this reason, a sweep-out process is adopted, with the diagonal components of the matrix as the main point. In the solution of simultaneous linear equations of a symmetrical matrix where 0 is present, a small value $\epsilon$ (minimum value of the calculation accuracy) is added to permit solution of the equations. However, this small value $\epsilon$ is likely to influence the accuracy of the solution.

Therefore, when performing co-ordinate conversion of a sub structure, the method of solving equation (26) using a constraint relation, the diagonal components of a portion $$\begin{bmatrix} 0 & 0 & 0 \\ 0 & H_{ii} & 0 \\ 0 & 0 & H_{rr} \end{bmatrix}$$

in the basic section of the equation may include 0. For this reason, higher accuracy can be obtained by solving the equation not as a symmetrical matrix but as a complete matrix. When conventional constraint relation equations are used for co-ordinate conversion of a sub structure, the following problems occur.

(1) When simultaneous linear equations are solved as a symmetrical matrix, no solution or a merely approximate solution can be obtained.

(2) When the equations are solved as a complete matrix, an enormous memory capacity is necessary.

(3) Of the degrees of freedom concerning co-ordinate conversion among the degrees of freedom of the structure, those both before and after co-ordinate conversion are recognized. Therefore, the degrees of freedom are increased, and the memory capacity is increased.

(4) The equation scale is increased to increase the time required for solving the equations.

SUMMARY OF THE INVENTION

An object of the invention is to provide a system for analyzing the characteristics of an overall structure, in which the necessary calculation time and memory capacity are greatly reduced as compared to the prior art method of expressing information concerning co-ordinate conversion for each sub structure as a constraint relation equation based on the sub structure synthesis method and substituting into the overall system equation to a obtain solution, and which permits design efficiency increase and accuracy improvement and stabilization of solution.

BRIEF DESCRIPTION OF THE DRAWINGS

FIG. 14 is a view showing an overall system transfer function matrix based on the prior art sub structure synthesis method.

DESCRIPTION OF THE PREFERRED EMBODIMENTS

Figure 1:
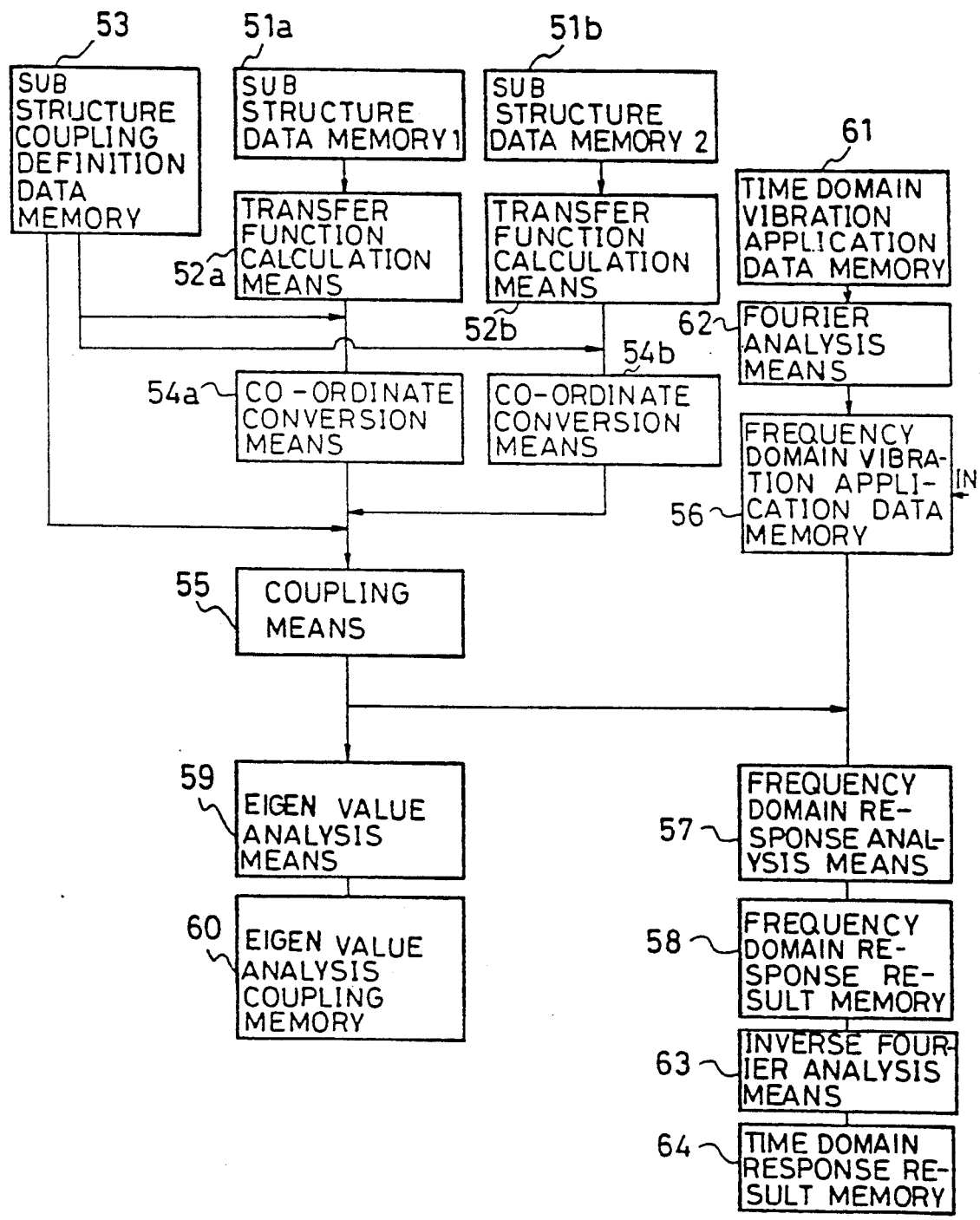
FIG. 1 is a block diagram showing a structure vibration simulation system as an embodiment of the invention.
Figure 2:
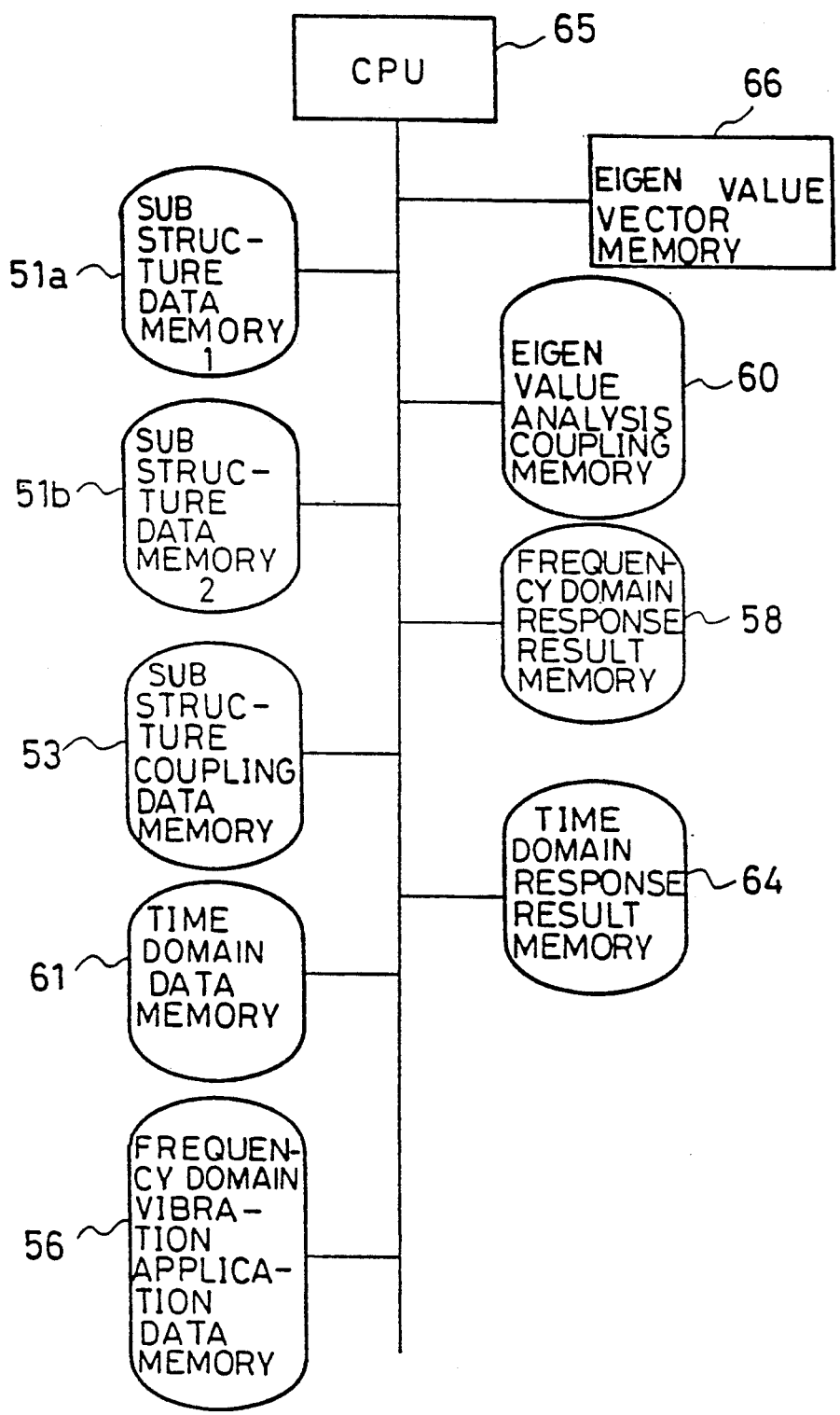
FIG. 2 is a block diagram showing a structure vibration simulation system as an embodiment of the invention.

FIGS. 1 and 2 are block diagrams showing the functions and construction of a structure vibration simulation system as one embodiment of the invention. Referring to the figures, designated at 51a and 51b are sub structure data memories for storing sub structure data of first and second sub structures, at 52a and 52b transfer function calculating means as an example of response characteristics calculating means for calculating a transfer function matrix of a structure from sub structure data obtained from sub structure data memories 51a and 51b (i.e., sub structure data obtained by measuring or analytically estimating the vibrations of the first and second structures of FIG. 3), at 53 a sub structure coupling data definition data memory as an example of data storage means for providing the positional relations of the co-ordinates of the first and second structures to an overall system co-ordinate system as co-ordinate conversion data in terms of Euler's angles ($\theta$, $\phi$ and $\psi$) of three-dimensional co-ordinate conversion and storing coupling definition data specifying a method of coupling of the first and second structures as rigid coupling of degrees of freedom (common use of degrees of freedom) or soft coupling (coupling by spring and damper), at 54a and 54b co-ordinate conversion means for producing a three-dimensional co-ordinate conversion matrix from the positional relation of the co-ordinates provided by the Euler's angles $\theta$, $\phi$ and $\psi$ of the three-dimensional co-ordinate conversion and converting the transfer function matrix obtained by the transfer function calculating means to the transfer function matrix in the overall system co-ordinate system, at 55 coupling means for coupling together the transfer function matrices of the first and second structures obtained by the transfer function calculating means 52a and 52b according to the coupling conditions determined by the coupling definition data stored in the sub structure coupling definition data memory 53 to produce a transfer function matrix of a coupled structure, at 59 eigen value analysis means for analyzing the eigen mode and mode shape of the coupled structure with the transfer function matrix from coupling means 55, at 60 an eigen value analysis result memory for storing analysis results obtained by eigen value analysis means 59, at 61 a time domain vibration application data memory for storing vibration application data of the structure in the time domain, at 62 Fourier analysis means for converting the time domain vibration application data by Fourier analysis to frequency domain vibration application data for analysis in the frequency domain, at 56 a frequency domain vibration application data memory for storing frequency domain vibration application data obtained from the Fourier analysis means or supplied directly, at 57 frequency domain response analysis means for analyzing the response of the coupled structure at each point thereof in frequency domain from the transfer function matrix from coupling means 55 and frequency domain vibration application data from Fourier analysis means 62 or supplied directly (i.e., frequency domain vibration application data from frequency domain vibration data memory 56), and at 58 a frequency domain response result memory for storing frequency domain response results obtained from frequency domain response analysis means 57, at 63 inverse Fourier analysis means for converting the frequency response analysis results obtained from frequency domain response analysis means 57 (i.e., contents of frequency domain response result memory 58), and at 64 a time domain response result memory for storing the time domain response analysis results. Referring to FIG. 2, designated at 65 is a CPU, which has the functions of the individual means noted above and controls the memories and main storage means 66 for data processing.

Now, functions of the main means in this embodiment will be described.

The transfer function calculating means 52a and 52b determine the transfer function matrices for the individual elements using data obtained by experimental FFT analysis or finite element method analysis. This method of calculation is one of the following five types depending on the kind of sub structure data. The transfer function that is determined is one of two kinds, i.e., a transfer function matrix [G] of compliance (displacement/force) and a transfer function matrix H of dynamic stiffness (force/displacement). Where the transfer function matrix [G] of compliance is calculated, in the following method, the inverse matrix is obtained and is converted to the transfer function of dynamic stiffness as shown by $$[H]=[G]^{-1} \tag{51}$$

Following equations (52) to (66) show the respective types of transfer function calculating means.

(a) Direct matrix input type $$[H(\omega)]=(-\omega^2[M]+j\omega[C]+[K]) \tag{52}$$

$$[H(\omega)]=(-\omega^2[M]+j[B]+[K]) \tag{53}$$

where $\omega$: represents angular frequency,

[M]: mass matrix,
[K]: stiffness matrix,
[C]: viscosity damping matrix, and
[B]: structure damping matrix.

(b) Non-constraint mode synthesis type (real mode)

$$[G(\omega)] = -\frac{[Y]}{\omega^2} + \sum_{r=1}^{n} \frac{\{\psi_r\}\{\psi_r\}^T}{m_r(-\omega^2 + j\omega \zeta_r \omega_r + \omega_r^2)} + [Z] \tag{54}$$

$$[G(\omega)] = -\frac{[Y]}{\omega^2} + \sum_{r=1}^{n} \frac{\{\psi_r\}\{\psi_r\}^T}{m_r(-\omega^2 + jg_r \omega_r^2 + \omega_r^2)} + [Z] \tag{55}$$

where,
$\omega$: represents angular frequency,
n : mode number,
$m_r$: modal mass (r=1 to n),
$\omega_r$: eigen value in mode r (r=1 to n),
$\{\psi_r\}$: mode vector in mode r (r=1 to n),
$\zeta_r$: mode viscous damping ratio in mode r(r=1 to n),
$g_r$: structure damping ratio in mode r (r=1 to n),
[Y]: residual mass matrix, and
[Z]: residual stiffness matrix.

(c) Non-restrictive mode synthesis type (complex mode)

$$[G(\omega)] = -\frac{[Y]}{\omega^2} + \sum_{r=1}^{n} \left( \frac{\{\psi_r\}\{\psi_r\}^T}{a_r(j\omega - P_r)} + \frac{\overline{\{\psi_r\}\{\psi_r\}}}{\overline{a_r(j\omega - P_r)}} \right) \tag{56}$$

(− representing conjugate)

$$[G(\omega)] = -\frac{[Y]}{\omega^2} + \sum_{r=1}^{n} \frac{\{\phi_r\}\{\phi_r\}^T}{m_r(-\omega^2 + jg_r \omega_r^2 + \omega_r^2)} + [Z] \tag{57}$$

where,
$\omega$: represents angular frequency,
n: mode number,
$a_r$: residue (complex value) in mode r,
$P_r$: complex eigen value in mode r,
$m_r$: mode mass in mode r,
$g_r$: mode structure damping ratio in mode r, $\omega r$
$\omega_r$: complex eigen value in mode r,
$\{\psi_r\}$: complex mode vector in mode r,
[Y]: complex regidual mass matrix, and
[Z]: complex regidual stiffness matrix.

(d) Transfer function synthesis type $$[G(\omega)]=\text{Rational expression of } (j\omega) \tag{58}$$

$$[H(\omega)]=\text{Rational expression of } (j\omega) \tag{59}$$

(e) Scale element $$H(\omega)=-\omega^2 m \text{ (m: scalar mass)} \tag{60}$$

$$H(\omega)=j\omega c \text{ (c: ground scalar viscosity damping)} \tag{61}$$

$$H(\omega) = j\omega \begin{bmatrix} c & -c \\ -c & c \end{bmatrix} \text{(c: scalar viscosity damping among degrees of freedom)} \tag{62}$$

$$H(\omega)=j^b \text{(b: ground scalar structure damping)} \tag{63}$$

$$H(\omega) = j \begin{bmatrix} b & -b \\ -b & b \end{bmatrix} \text{(b: scalar structure damping)} \tag{64}$$

$$H(\omega)=k \text{(k: ground scalar stiffness)} \tag{65}$$

$$[H(\omega)] = \begin{bmatrix} k & -k \\ -k & k \end{bmatrix} \text{(k: scalar stiffness among degrees of freedom)} \tag{66}$$

Figure 3:
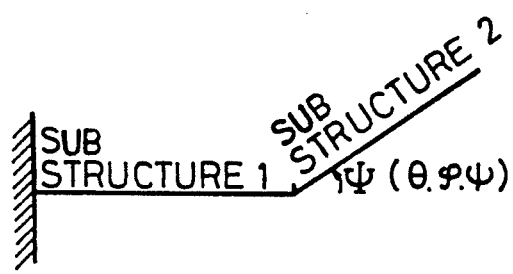
FIG. 3 is a view showing an example of a sub structure combination.

FIG. 3 shows an example of sub structure coupling. Here, the coupling angle is $\Psi$.

In the method of sub structure analysis, a sub structure analysis obtained by analysis for a sub structure unit after another (expressed by mode data, MKC matrices, transfer function matrices, etc.) is synthesized, and the characteristics of the overall structure are estimated.

The characteristics of the sub structure are analyzed in a co-ordinate system under certain conditions and are not always identical with the co-ordinate system of the overall system. Accordingly, when coupling together structures with certain three-dimensional angles $\Psi$ ($\theta$, $\phi$, $\psi$), it is necessary to perform co-ordinate conversion from each co-ordinate system under analysis into the co-ordinate system of the overall system.

The co-ordinate conversion of the local structure is defined as follows.

(1) Local co-ordinates in the neighborhood of the coupling point are referred to as co-ordinate systems a and b.

(2) The coupling angles are given as Euler angles, $\Psi$ ($\theta$, $\phi$, $\psi$).

Figure 4:
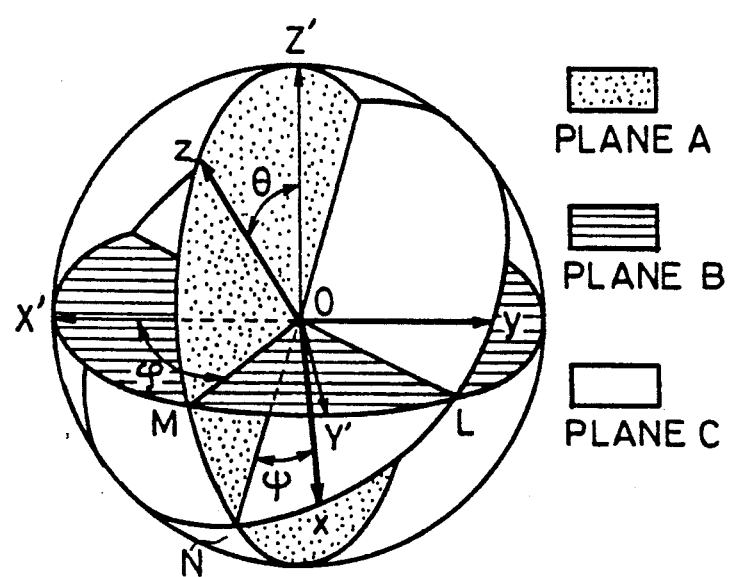
FIG. 4 is a view showing Euler angles.

Referring to FIG. 4, there are co-ordinate systems a (x, y, z) and b (X', Y', Z'), where $\theta$—angle between Z' and z', $\phi$—angle to X' of intersection OM between a plane A containing Z' and z and a plane B containing X' and Y', and $\psi$—angle to x of intersection ON between a plane C containing x and y and a plane A.

In co-ordinate conversion means 54a and 54b, a three-dimensional co-ordinate conversion matrix $$T = \begin{pmatrix} \cos\theta\cos\phi\cos\psi - \sin\phi\sin\psi & -\cos\theta\cos\phi\sin\psi - \sin\phi\cos\psi & \sin\theta\cos\phi \\ \cos\theta\sin\phi\cos\psi + \cos\phi\sin\psi & -\cos\theta\sin\phi\sin\psi + \cos\phi\cos\psi & \sin\theta\cos\phi \\ -\sin\theta\cos\psi & \sin\theta\sin\psi & \cos\theta \end{pmatrix} \quad (67)$$

is obtained from Euler's angles $\theta$, $\phi$ and $\psi$ concerning three-dimensional co-ordinate conversion defined by the sub structure coupling definition data memory 53. However, Euler's angles $\theta$, $\phi$ and $\psi$ concerning three-dimensional co-ordinate conversion defined by the sub structure coupling definition data memory are determined by the following method. The co-ordinate system before the conversion is denoted by a (x, y, z) and that after the conversion is denoted by b (x', y', z').

For example, the Euler's angles when the angle is rotated as x and y axes about z axis without conversion thereof are $\theta=0$ $\phi=\alpha$ and $\psi=0$ or $\theta=0$, $\phi=0$ and $\psi=\alpha$.

More specifically, when the z axis itself is unchanged, $\theta=0$ and $\psi+\phi=\alpha$. Thus, $$Tz = \begin{pmatrix} \cos\alpha & -\sin\alpha & 0 \\ \sin\alpha & \cos\alpha & 0 \\ 0 & 0 & 1 \end{pmatrix} \quad (68)$$

When the z axis itself is unchanged.

$$Ty = \begin{pmatrix} \cos\theta & 0 & \sin\theta \\ 0 & 1 & 0 \\ -\sin\theta & 0 & \cos\theta \end{pmatrix} \quad (69)$$

More specifically, assuming a co-ordinate system of a sub structure at a certain coupling point to be the b co-ordinate system and a co-ordinate system of the coupled structure to be the co-ordinate system, x'=xb . . . r'=rb and x=xa . . . r=ra in FIG. 4, and considering conversion of degrees of freedom xb, yb, zb, pb, qb and rb of the b co-ordinate system to freedom degrees xa, ya, za, pa, qa, and ra of the a co-ordinate system, $$\begin{Bmatrix} x^a \\ y^a \\ z^a \\ p^a \\ q^a \\ r^a \end{Bmatrix} = \begin{bmatrix} T & 0 \\ 0 & T \end{bmatrix} \begin{Bmatrix} x^b \\ y^b \\ z^b \\ p^b \\ q^b \\ r^b \end{Bmatrix} \quad (70)$$

Substituting $[\Gamma] = \begin{bmatrix} T & 0 \\ 0 & T \end{bmatrix}$ $$\begin{Bmatrix} x^a \\ y^a \\ z^a \\ p^a \\ q^a \\ r^a \end{Bmatrix} = [\Gamma] \begin{Bmatrix} x^b \\ y^b \\ z^b \\ p^b \\ q^b \\ r^b \end{Bmatrix} \quad (71)$$

$T^{-1}$ is calculated with respect to T obtained in equation (67).

Figure 5:
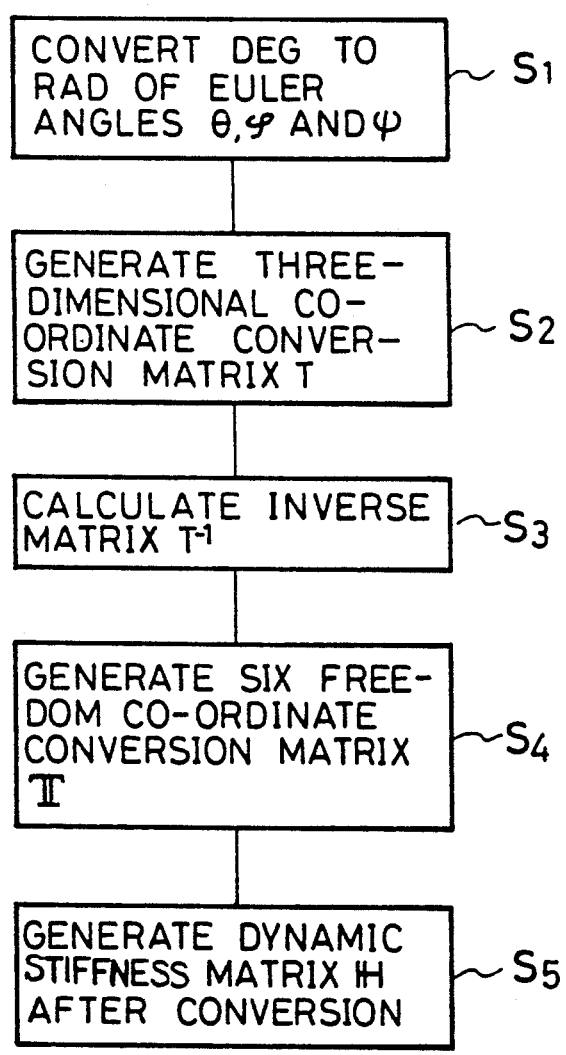
FIG. 5 is a flow chart illustrating the operation of the co-ordinate conversion means.

FIG. 5 is a flow chart of the conversion of the degree (DEG) into radian (RAD) by co-ordinate conversion means 54a and 54b. In step S2, T in equation (67) is obtained, and its inverse matrix $T^{-1}$ is calculated in step S3. In step S4, the co-ordinate conversion matrix $|\Gamma$ is produced. In step S5, the dynamic stiffness matrix $|H$ after conversion is produced from $H=[|\Gamma^{-1}][|H][|\Gamma]$, where [H] is the dynamic stiffness matrix before conversion.

Further, the inverse matrix $[\Gamma^{-1}]$ of angular conversion matrix $[\Gamma]$ of the entire sub structures is produced for directions x to z and p to r of the degrees of freedom defined with the sub structures for elements of the 3 by 3 matrix of $T^{-1}$. If the degrees of freedom defined by the sub structure are x to z and p to r in the mentioned order.

$$[\Gamma^{-1}] = \begin{bmatrix} T^{-1} & 0 \\ 0 & T^{-1} \end{bmatrix} \quad (72)$$

The equation of motion $$\begin{bmatrix} 0 & 0 & 0 & -I \\ 0 & H_{ii} & 0 & \Gamma^T \\ 0 & 0 & H_{rr} & 0 \\ -I & \Gamma & 0 & 0 \end{bmatrix} \begin{Bmatrix} X_d \\ X_i \\ X_r \\ P_d \end{Bmatrix} = \begin{Bmatrix} F_d \\ 0 \\ F_r \\ 0 \end{Bmatrix} \quad (26)$$

shown in the prior art example is disassembled to obtain equations.

$$-\{P_d\} = \{F_d\} \quad (73)$$

$$[H_{ii}]\{X_i\} + [\Gamma]\{P_d\} = 0 \quad (74)$$

$$[H_{rr}]\{X_r\} = \{F_r\} \quad (75)$$

$$-\{X_d\} + [\Gamma]\{X_i\} = 0 \quad (76)$$

From equations (73) and (74)

$$[H_{ii}]\{X_i\} = [\Gamma^T]\{F_d\} \quad (77)$$

$$\{X_i\} = [H_{ii}]^{-1}[\Gamma^T]\{F_d\} \quad (78)$$

Also, from equations (76) and (78)

$$\{X_d\} = [\Gamma][H_{ii}]^{-1}[\Gamma^T]\{F_d\} \quad (79)$$

$$\therefore [\Gamma]^{-1}[H_{ii}]^{-1}[\Gamma^T]^{-1}\{X_d\} = \{F_d\} \quad (80)$$

$$\therefore [\Gamma^{-1}]^T[H_{ii}][\Gamma^{-1}]\{X_d\} = \{F_d\} \quad (81)$$

From equations (75) and (81) we obtain a matrix.

$$\begin{bmatrix} [\Gamma^{-1}]^T [H_{ii}] [\Gamma^{-1}] & 0 \\ 0 & [H_{rr}] \end{bmatrix} \begin{bmatrix} X_d \\ X_r \end{bmatrix} = \begin{bmatrix} F_d \\ F_r \end{bmatrix} \quad (82)$$

As shown above, equation (82) is derived from equation (23), and both the equations are equivalent. Equation (82) may be solved after performing calculation of co-ordinate conversion of independent degree of freedom H ii to $[\Gamma^{-1}]^T[H_{ii}][\Gamma^{-1}]$.

Co-ordinate conversion means 54a and 54b performs the operation expressed as $$[H'(\omega)] = [\Gamma^{-1}]^T[H(\omega)][\Gamma^{-1}] \quad (83)$$

(where T represents transposed) with respect to the transfer function matrix [H(ω)] obtained from transfer function calculating means 52a and 52b, thus deriving the transfer function matrix [H'(ω)] after co-ordinate conversion.

Coupling means 55 synthesizes the transfer function [H_i] to [H_n] of dynamic stiffness (force/displacement) of N elements obtained by transfer function calculating means 52a and 52b to produce an equation of motion based on the transfer function matrix [H] after coupling, given as

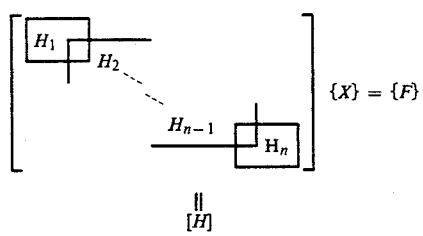

(84)

When coupling is performed, like degree of freedom data as noted in connection with the prior art example are added together. Where there is a constraint relation among degrees of freedom given as $$\{X_d\} = [\Gamma]\{X_i\} \quad (85)$$

where Xi represents an independent degree of freedom, Xd represents a dependent degree of freedom, and [Γ] represents a constraint relation matrix, the equation of motion after coupling is $$\begin{bmatrix} H_{dd} & H_{di} & H_{dr} & -I \\ H_{id} & H_{ii} & H_{ir} & \Gamma \\ H_{rd} & H_{ri} & H_{rr} & 0 \\ -I & \Gamma & 0 & 0 \end{bmatrix} \begin{Bmatrix} X_d \\ X_i \\ X_r \\ P \end{Bmatrix} = \begin{Bmatrix} F_d \\ F_i \\ F_r \\ 0 \end{Bmatrix} \quad (86)$$

However, $$[H] = \begin{bmatrix} H_{dd} & H_{di} & H_{dr} \\ H_{id} & H_{ii} & H_{ir} \\ H_{rd} & H_{ri} & H_{rr} \end{bmatrix}, \quad [X_r]: \text{Degree of freedom free from constraint relation}$$

$\{P\}$: Constraint force $$\begin{bmatrix} F_d \\ F_i \\ F_r \end{bmatrix}: \text{Force vector}$$

The frequency domain response analysis means 57 solves equation (84) or (86) of motion obtained by coupling means 55 to obtain a response value of the real degree of freedom.

Further, when there is no damping, eigen value analysis means 59 separates the transfer function of dynamic stiffness (force/displacement) obtained from coupling means 55 into mass matrix [M] and a stiffness matrix [K] using an equation $$[H] = -\omega^2[M] + [K] \quad (87)$$

and solves eigen value problem $$[M] = \{\ddot{X}\} + [K]\{X\} = \{O\} \quad (88)$$

This is referred to as the sub-space method.

When there is damping, the designated frequency range is divided, equation of motion (84) or (86) is solved for each frequency, and the response peak value is searched to obtain an eigen value and eigen mode. This is referred to as the frequency search process.

Fourier analysis means 62 performs FFT (fast Fourier transform) of the vibration application condition given in the time domain to obtain frequency domain vibration application data, and inverse Fourier analysis means 63 performs inverse FFT of the response analysis results obtained in frequency domain response analysis means 58 to obtain the time domain response analysis results. Fourier analysis means 62 and inverse Fourier analysis means 63 are used when and only when time domain response results are necessary.

Now, the overall operation of this embodiment will be described. The structure coupling simulation system of this embodiment is constituted by program control. The program is usually stored in an auxiliary memory (not shown) such as non-volatile memory, and at the time of initialization it is loaded in main memory 66 and executed by CPU 65.

In this system, sub structure data is stored in advance as input data in sub structure data memories 51a and 51b, co-ordinate conversion data and coupling definition data are stored in advance in sub structure coupling data memory 53, and vibration application data are stored in time domain data memory 61 when performing time domain analysis, while they are stored in frequency domain data memory 56 when performing frequency domain analysis. CPU 65 reads out data from memories 51a, 51b, 53, 61 and 56 according to the program, performs the simulation analysis using main memory 66 and stores the results in frequency response result memory 58, time domain response result memory 64 and eigen value analysis result memory 60. These memories are all on a magnetic disk system. Particularly, memories 58, 64 and 60 which provide results may be implemented by a line printer system. Further, memories 58, 64 and 60 may be used to produce flags with a flag generation program using their output data as input data. Transfer function calculating means 52 calculates a transfer function using equations (52) to (66) for conversion depending on the kind of sub structure data. When the transfer function is of the compliance (displacement/force) type, it is converted to one of dynamic stiffness matrix (force/displacement) type using equation (51) to obtain the transfer matrix of dynamic stiffness. Co-ordinate conversion means 54 converts the transfer matrix of dynamic stiffness obtained by the transfer function calculating means into a transfer function matrix of the overall structure co-ordinate system using the equations of conversion. Coupling means 55 synthesizes the transfer function after coupling using equation (84). When there is a constraint relation of degrees of freedom as given by equation (85), the constraint relation equation is also incorporated to produce an overall system matrix and produce the matrix of equation (86). Frequency response analysis means 57 solves equation (86) of motion. In the case of a system without damping, eigen value analysis means 59 solves for an eigen value using the sub-space process given by equations (87) and (88). When there is damping, the response for each frequency in the designated frequency range is solved to search for the peak value of the response and determine an eigen value, the eigen value thus obtained being substituted into eigen value analysis memory 60.

Fourier analysis means 62 converts vibration application data given in the time domain into those in the frequency domain, the converted data being stored in the frequency domain vibration application data memory 56. Inverse Fourier analysis means 63 converts the response results obtained in the frequency domain to those in the time domain, the converted data being stored in the time domain response result memory 64.

Figure 6:
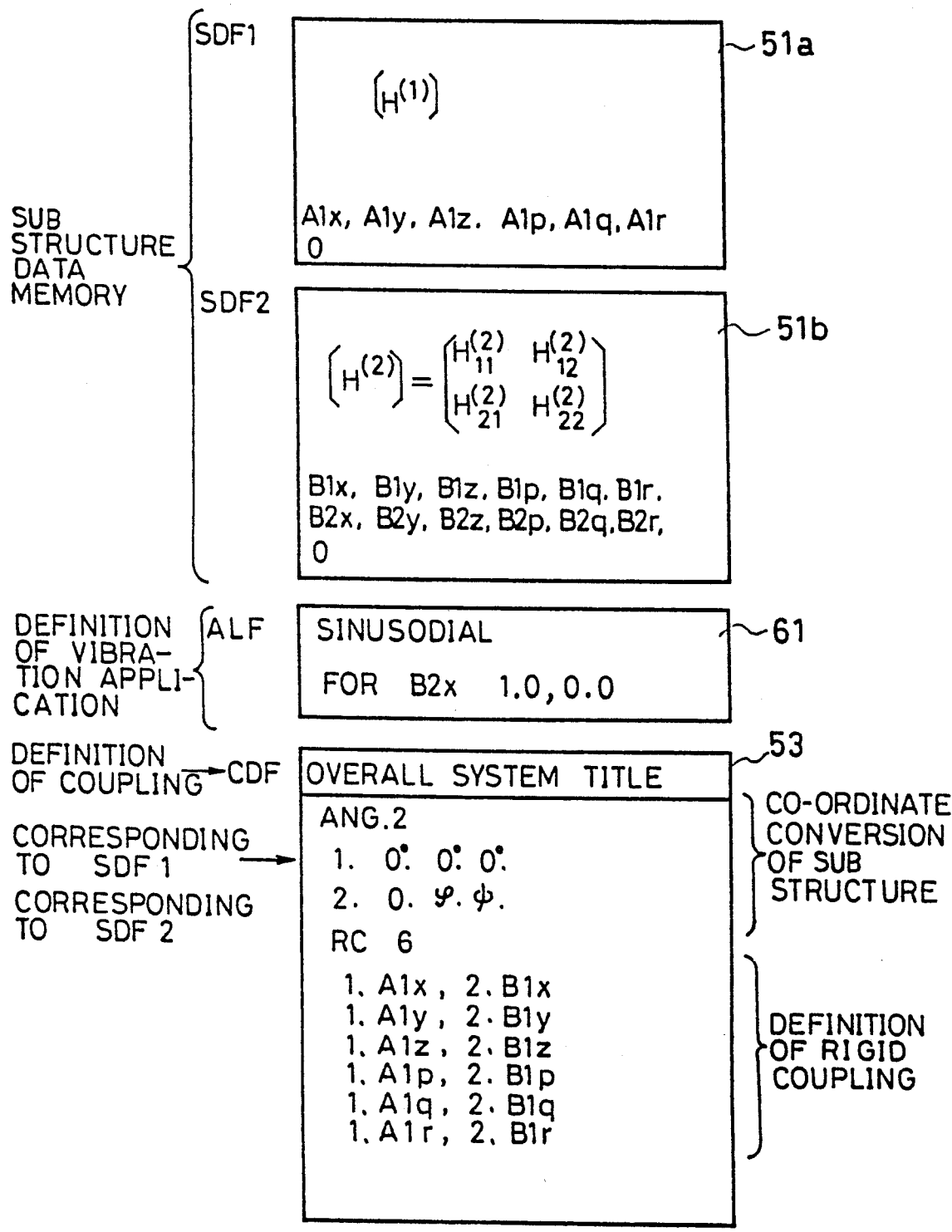
FIG. 6 is a view for explaining a system definition file of an embodiment of the invention.
Figure 12:
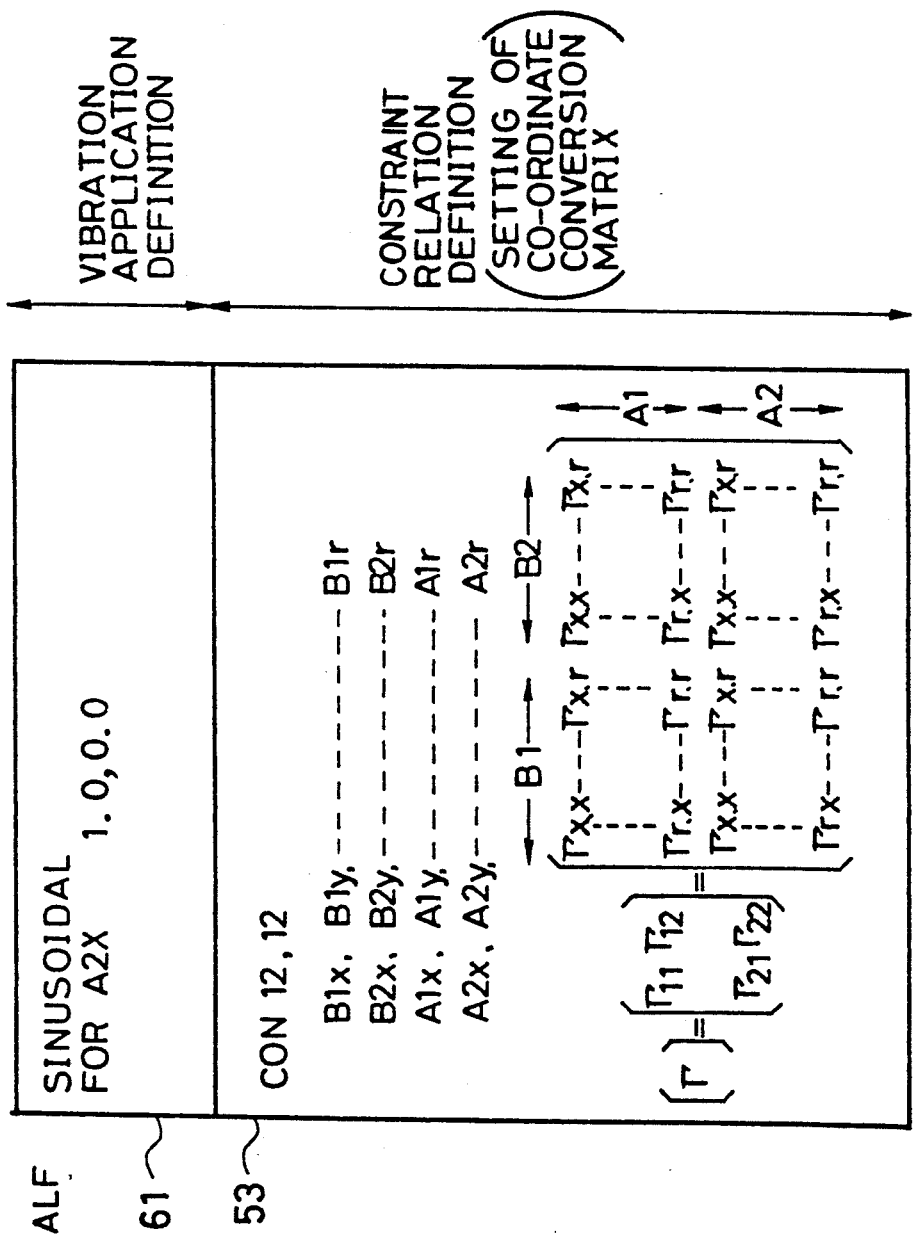
FIGS. 12a–12c are views for explaining a system definition file of a structure vibration simulation system based on a prior art structure synthesis method.
Figure 13:
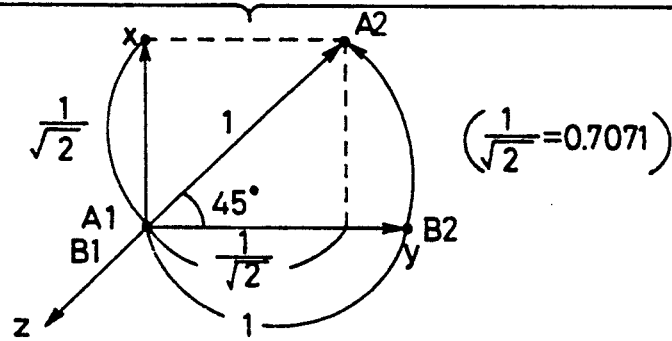
FIG. 13 is a view showing a constraint function matrix based on the prior art sub structure synthesis method.

Now, a specific example of the invention will be described with reference to the drawings. FIG. 6 shows a case of application of the invention to the prior art example of FIG. 12(a). Designated at 51a and 51b are sub structure data memories SDF1 and SDF2, at 61 time domain vibration application data memory ALF, and at 53 sub structure coupling definition data memory CDF. In memory SDF1 a transfer function matrix $[H^{(1)}]$ of sub structure 1 and six degrees of freedom are defined. In memory SDF2 a transfer function matrix $[H^{(2)}]$ measured by the B1-B2 co-ordinate system of sub structure 2 and 12 degrees of freedom are defined. In memory ALF, a frequency response is determined when an external force with an amplitude of 1.0 and a phase of 0.0 degree is applied to B2x. Memory CDF defines differences of angles of the co-ordinate systems of the sub structures with respect to the overall system co-ordinate systems. In ANG 2 and following, angles of two co-ordinate systems with respect to the overall system co-ordinate system are defined, and then Euler's angles in the individual sub structures are shown in each line. This example shows that the co-ordinate system of sub structure 1 is (1, 0°, 0°, 0°), the same as the co-ordinate system of the overall system and that the co-ordinate system of sub structure 2 has angles $\theta$, $\phi$ and $\psi$ of (2, $\phi$, $\psi$, $\theta$) with respect to the co-ordinate system of the overall system.

Following RC 6 shows that there are six degrees of freedom where the coupling condition is rigid coupling, indicating that degree of freedom A1x of sub structure 1 and degree of freedom B1x of sub structure 2 are rigidly coupled together. Likewise, degrees of freedom A1y and B1y, ..., A1r and B1r are rigidly coupled together. This means that degrees of freedom A1 and B1 commonly have six degrees of freedom.

Figures 7A, 7B:
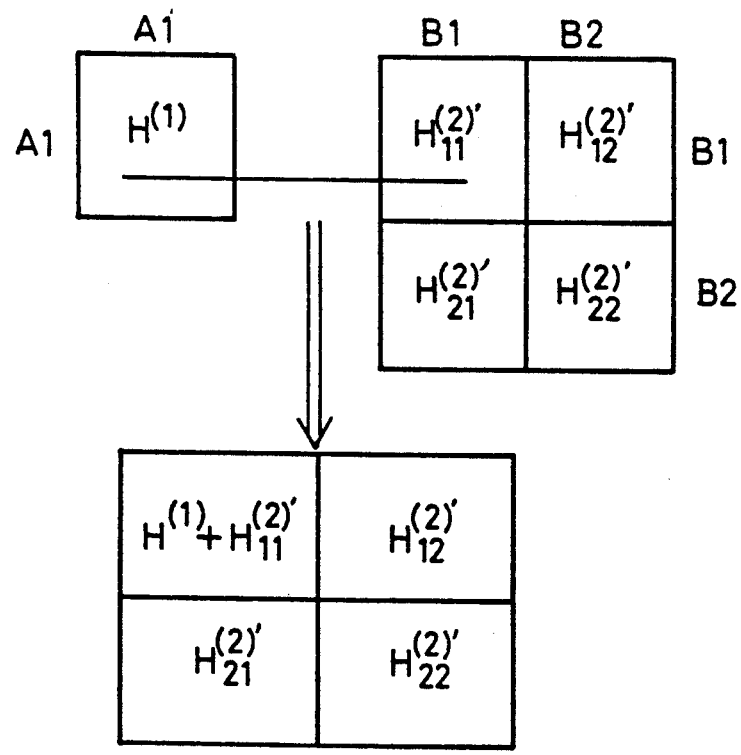
FIGS. 7a–7b is a view showing an overall system transfer function matrix in an embodiment of the invention.
Figure 10:
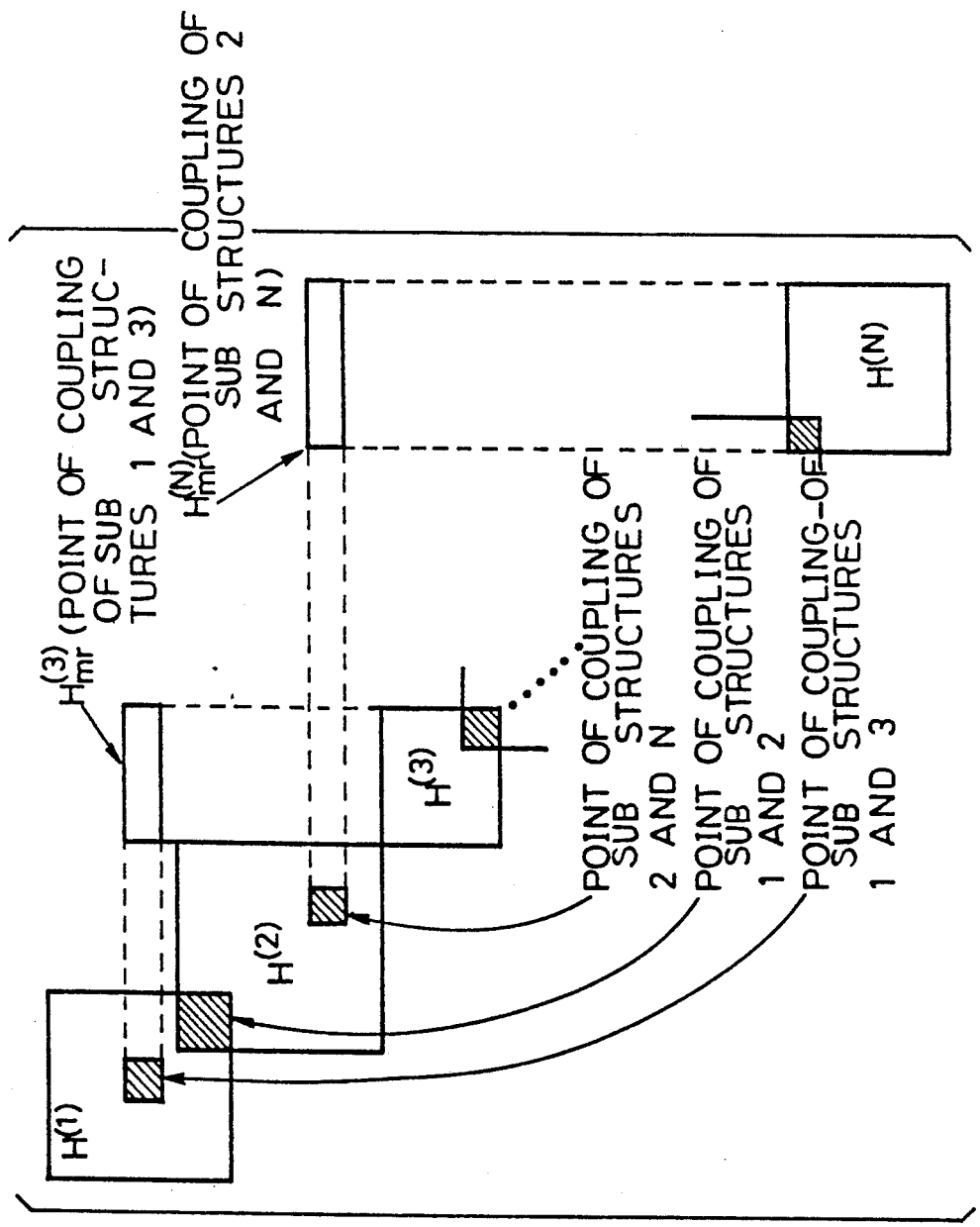
FIG. 10 is a view illustrating a method of coupling transfer function matrices.
Figure 11:
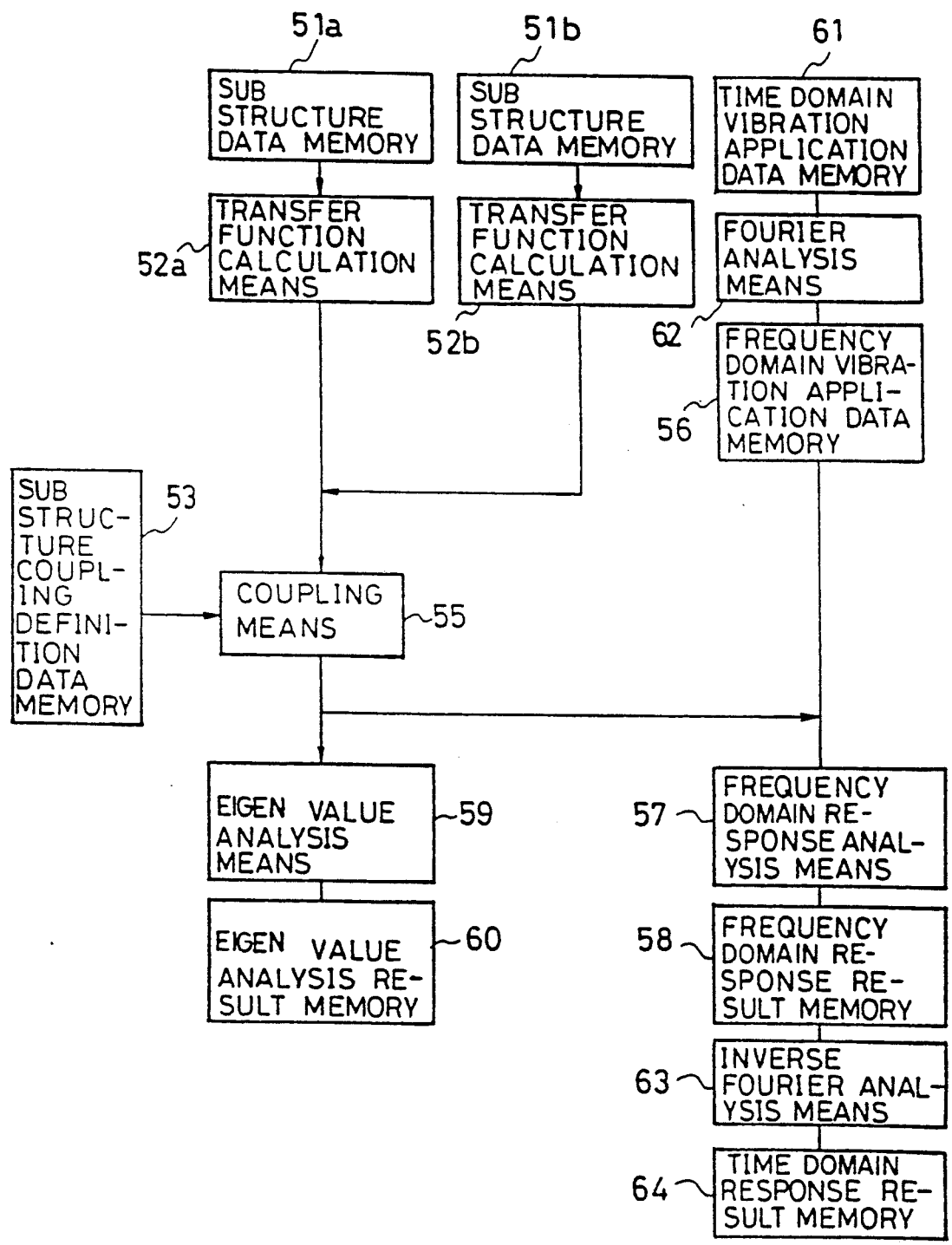
FIG. 11 is a block diagram showing a structure vibration simulation system based on a prior art sub structure synthesis method.

FIG. 7 is a view showing a transfer function matrix of the overall system in the above example. Shown in FIG. 7(a) is the result of the co-ordinate conversion obtained by performing the calculation of equation (83) with respect to the transfer function $H^{(1)}$ of sub structure 2. Shown in FIG. 7(b) is a method of combining the transfer functions of sub structure 1 and sub structure 2 after co-ordinate conversion to synthesize the transfer function matrix of the overall system. $H^{(1)}$ and $H_{11}^{(2)'}$ permit calculation of equation (13) for the same co-ordinate system. In this way, the matrix calculation is performed within a 12 by 12 size, which is one-fourth the size both in rows and columns as compared to the prior art 36 by 36 size shown in FIG. 10.

Figure 8C:
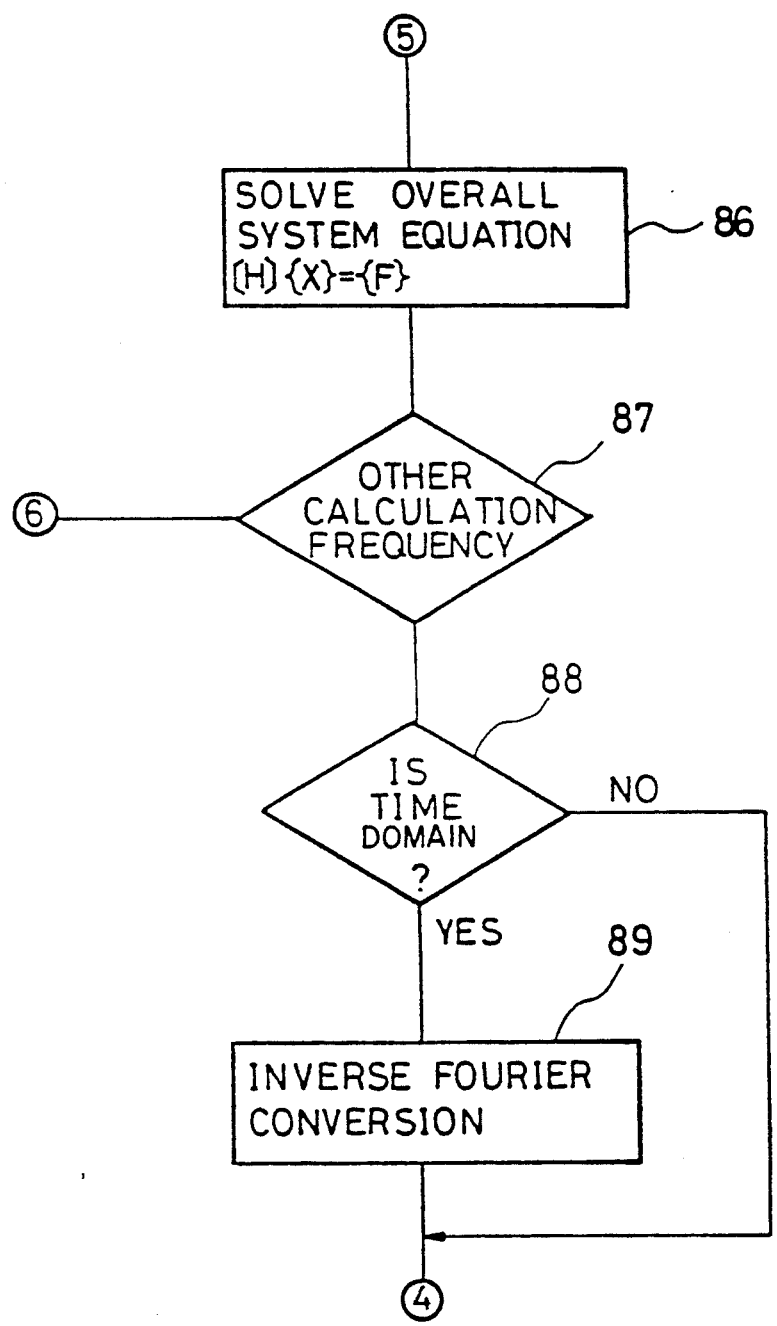
FIGS. 8a–8d is a flow chart for explaining the operation of the structure vibration simulation system as an embodiment of the invention.
Figure 8:
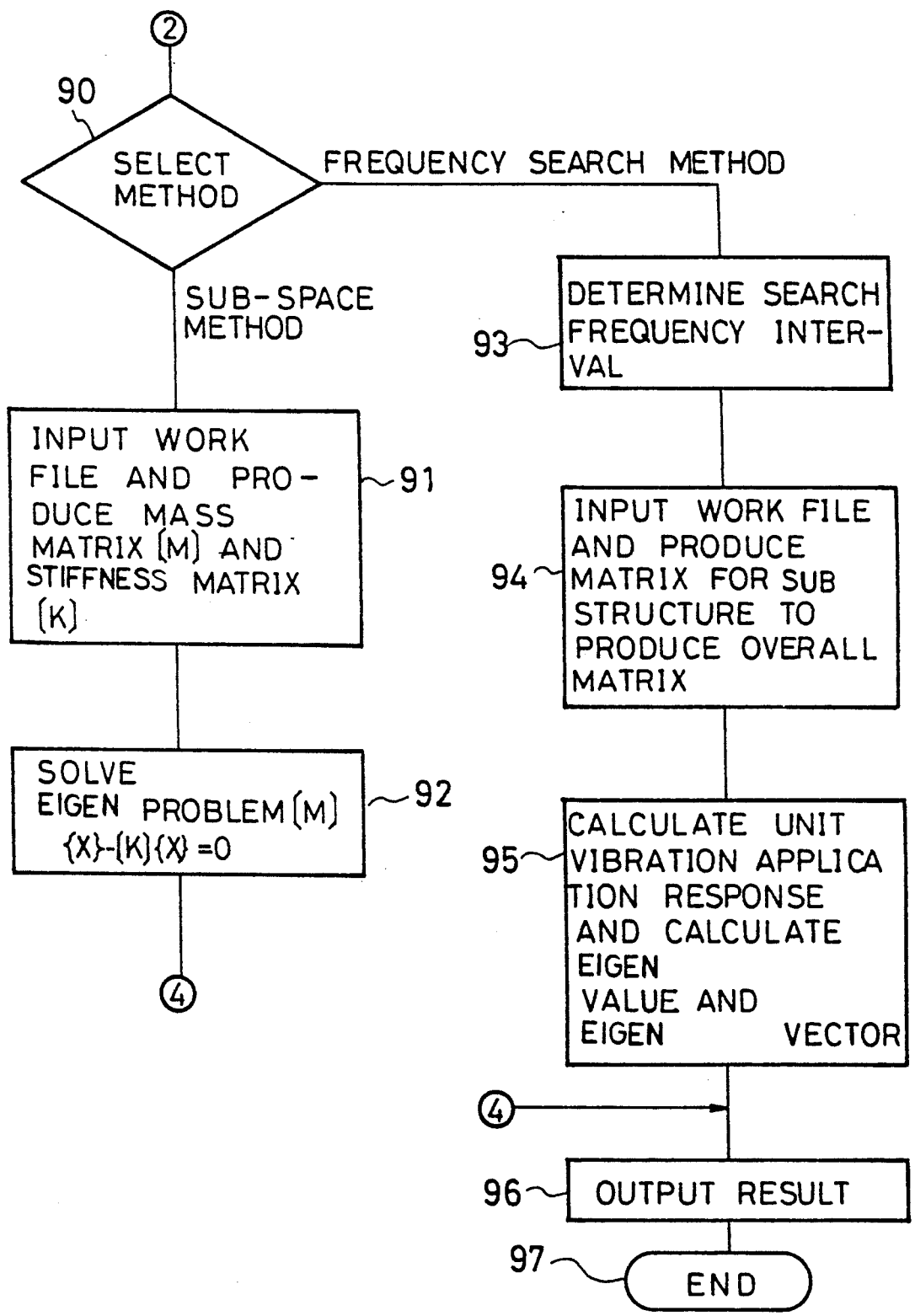
Figure 9:
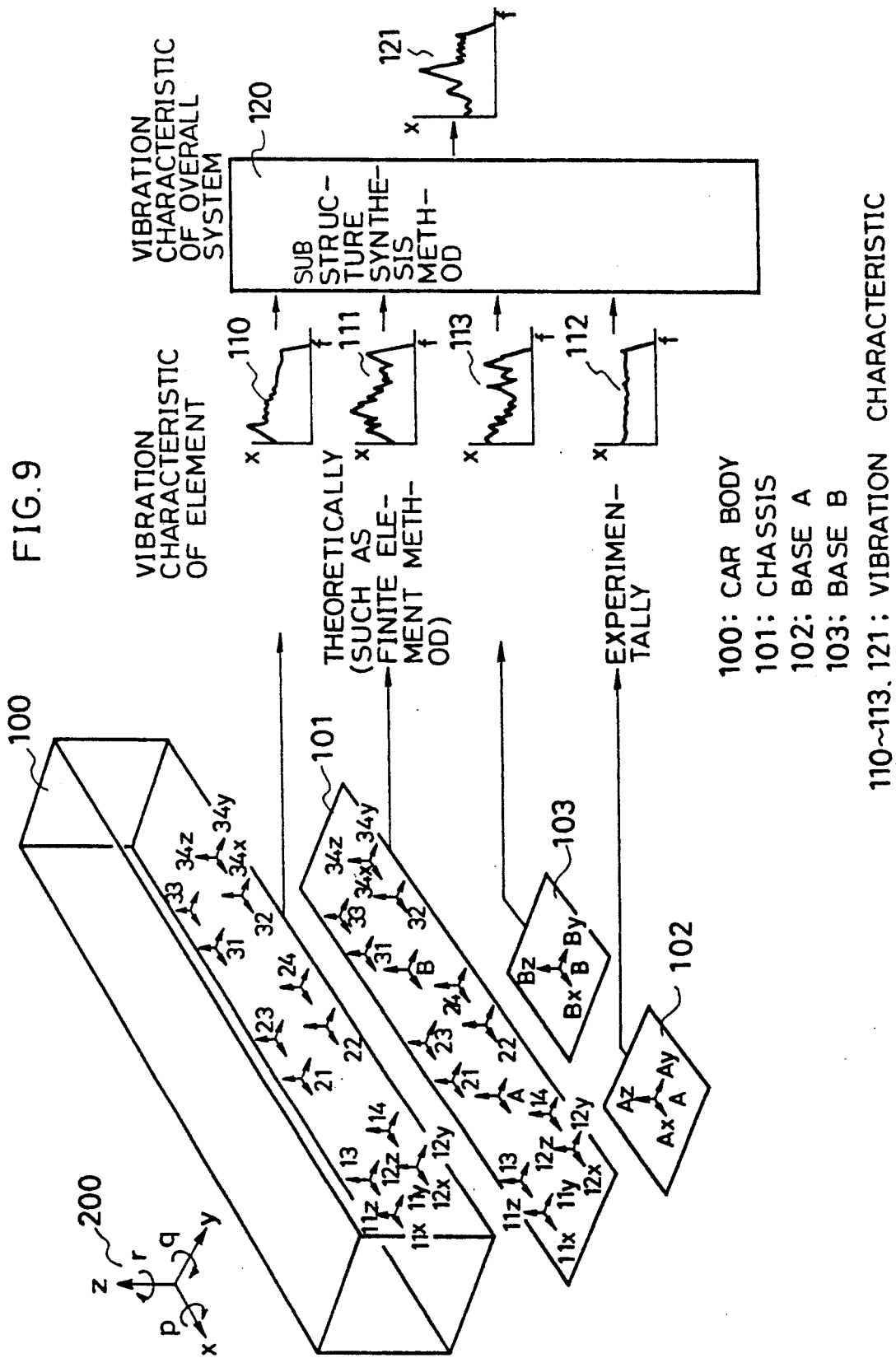
FIG. 9 is a view for explaining a simulation of a railway car.

FIG. 8 is a flow chart illustrating the operation of the system shown in FIG. 1. Designated at 67 to 97 are respective steps. In step 68 of this program, an area of main memory 66 used in the program is allocated. In step 69, an input data memory, freedom degree for obtaining kind of reply in the method of analysis and an output data memory. In step 70, the co-ordinate conversion data of the sub structure coupling data memory is read out, Euler's angles $\theta$, $\phi$ and $\psi$ with respect to the co-ordinate conversion for each sub structure are stored in a co-ordinate conversion table in memory, and the sub structures that constitute the overall structure are counted.

In step 71, sub structure data is stored in an operating file.

In step 72, coupling definition data in the sub structure coupling data memory is read out, and if there is rigid coupling, relations where degrees of freedom are equivalent are stored in a degree of freedom table. If the coupling is soft coupling, scalar element data are added.

In step 73, local data is input to produce a table in main memory 66 at a designated position. In steps 74 and 75, Fourier conversion by Fourier analysis means 62 of time domain data is shown. In step 76, the contents of the input sub structure data and the load data are printed on an output list. In step 77, the layout of main memory 66 used in the system is determined. In steps 78 to 95, analysis is performed for various kinds of analysis with various methods. In step 96, the results are output. Steps 79 through 89 show the operation of the response calculation means. In the response analysis, the processes in transfer function calculating means 52a and 52b, co-ordinate conversion means 54a and 54b, coupling means 55 and frequency domain response analysis means 57 are repeated in steps 79 to 87. In the response analysis in the time domain, the process of inverse Fourier analysis means 63 is performed in step 89. In steps 91 to 92, an eigen value analysis based on the sub-space method is performed, and in steps 93 to 95 an eigen value analysis based on the frequency search method is performed. The response calculations used in steps 94 and 95 are the same as those in steps 80 to 86.

As has been described in the foregoing, in the structure vibration simulation system embodiment of the invention, unlike the prior art three-dimensional co-ordinate conversion system using the constraint relation equation described above, a dynamic stiffness transfer matrix after co-ordinate conversion is obtained for each sub structure transfer matrix. Subsequently, a dynamic stiffness transfer function matrix is synthesized, the transfer function matrix after coupling is used to obtain the eigen value and eigen mode of the overall structure, or the response analysis based on the frequency domain under vibration application conditions is obtained, further FFT analysis of the vibration application condition is effected in the time domain, in the frequency domain inverse FFT analysis is performed on the response to obtain the response, and in this way the dynamic characteristics of the structure after coupling are simulated.

As has been shown, in the above embodiment for data defining the vibration characteristics of the first and second local structures using equations (52) to (66), co-ordinate conversion means 54a and 54b are provided between transfer function calculating means 52a and 52b and coupling means 55.

Thus, there is no need for adding any constraint relation matrix to the overall system matrix, and it is possible to reduce the required memory. That is, a small memory may be used for the overall system matrix. In addition, there is no possibility of the occurrence of a zero diagonal component, and it is possible to obtain an accurate solution of the symmetric matrix by the skyline method. (In the prior art, it was necessary to provide a differential as a diagonal component). Thus, it is possible to obtain vibration simulation of the structure accurately, quickly and with less memory capacity as compared to the prior art.

Further, with this embodiment a desired number of sub structures can be coupled together at a time and at every angle. Thus, particularly when evaluating the overall reliability of a complicated machine design, an overall evaluation can be obtained without performing a complicated finite element method analysis with respect to the overall structure or an experimental analysis after trial manufacture but from structure unit data. It is thus possible to obtain an increase in efficiency of the machine design.

While in the above embodiment eigen value analysis means 59 uses a sub-space method and a frequency search method, the same effects can be obtained using other methods. Further, while memories 51a, 51b, 56, 61, 60, 58 and 64 use magnetic disk systems, memories 58, 66 and 64 for storing output results may consists of line printers or the line.

Further, it is possible to provide the main memory with the roles of vibration application data memory 56 for storing the contents coverted in Fourier conversion means 62 and frequency domain response result memory 58 for storing the contents given as intermediate results of the time domain analysis.

Further, it is possible to use any desired number of sub structure data memories 51a and 51b within the permissible memory capacity of the system.

Further, while sub structure coupling definition data memory 53 has two different kinds of data, i.e., co-ordinate conversion data and coupling definition data, it may be replaced with two separate memories having different functions.

Further, while the above embodiment has been described in conjunction with a structure vibration simulation apparatus used for machine structure design in the fields of power plants, traffic, space, communication, electronics, devices, electric home appliances and dwellings, the invention is also applicable not only to the simulation of vibrations but also to the characteristic analysis of coupled devices consisting of other elements as apparatus for analyzing the characteristics of an overall structure. For example, the invention is applicable to numerical simulation for the three-dimensional analysis of fluid and output simulation of electric circuits at the time of coupling.

Further, while in the above embodiment transfer functions are used for expressing characteristics, they are by no means limiting, and other methods of expression may be adopted.

As has been shown in the foregoing, according to the invention co-ordinate conversion means is provided between local characteristics calculating means and coupling means. It is thus possible to obtain an analysis of the characteristics of the overall system, thus further reducing the time for producing data concerning characteristics analysis, time and labor for calculation and thus permitting a great increase in design efficiency.

What is claimed is:

1. An apparatus for analyzing coupling characteristics of a system consisting of a plurality of unit structures coupled to one another and having respective physical characteristics comprising:
   a first memory for storing physical data of each of said unit structures;
   a plurality of calculating means each for calculating a transfer function matrix of each of said unit structures according to said physical data;
   a second memory for storing definitions of co-ordinate conversion data and coupling concerning said unit structures
   a plurality of co-ordinate conversion means for generating co-ordinate conversion matrices from said co-ordinate conversion data and converting said transfer function matrices into those for the system;
   coupling means for coupling together said transfer function matrices in said system according to said definitions of coupling and generating transfer function matrices concerning said coupled system;
   eigen value analysis means for analyzing an eigen mode and mode shape of said coupled system according to said transfer function matrices;
   a third memory for storing forcing function data in the time domain with respect to each of said unit structures;
   Fourier analysis means for converting said forcing function data into those in the frequency domain;
   response analysis means for analyzing a response in the frequency domain concerning a point of measurement of said coupled system according to the transfer function matrices from said coupling means and forcing function data in the frequency domain; and
   inverse Fourier analysis means for converting the results of said response analysis into those in the time domain.

2. The apparatus according to claim 1, wherein said first to third memories are provided on a magnetic disk unit.

3. A method of analyzing coupling characteristics comprising:

a step of calculating a transfer function matrix of each of a plurality of unit structures from physical data thereof;

a step of generating co-ordinate conversion matrices from co-ordinate conversion data of each of said unit structures, and converting said transfer function matrices into those for the system;

a step of coupling together said transfer function matrices in said system according to definitions of coupling and generating transfer function matrices concerning a coupled system obtained by coupling together said unit structures;

a step of analyzing an eigen mode and mode shape of said coupling system according to said transfer function matrices;

a step of converting vibration application data in the time domain with respect to said unit structures through Fourier analysis into those in the frequency domain;

a step of analyzing a response to vibrations in the frequency domain concerning a point of measurement on said coupled system from the transfer function matrices of said coupled system and forcing function data in the frequency domain; and a step of performing inverse Fourier conversion of the results of said response analysis into those in the time domain.

4. The method according to claim 3, wherein said physical data is obtained by measuring or analyzing vibrations of said unit structures.

5. The method according to claim 3, wherein said co-ordinate conversion data are three-dimensional co-ordinates of Euler angles.

6. The method according to claim 3, wherein said definitions of coupling are specified as rigid or soft coupling of said unit structures to one another.

7. The method according to claim 3, wherein said point of measurement consists of a plurality of degrees of freedom.

8. The method according to claim 3, wherein said transfer function matrices are calculated from data obtained through experimental FFT analysis or finite element analysis.

9. The method according to claim 3, wherein said transfer function matrices consist of those of compliance (displacement/force) and dynamic stiffness (force/displacement).

* * * * *